(12) United States Patent
Hsiung

(10) Patent No.: US 12,324,221 B2
(45) Date of Patent: Jun. 3, 2025

(54) SEMICONDUCTOR DEVICE AND FORMATION METHOD THEREOF

(71) Applicant: TAIWAN SEMICONDUCTOR MANUFACTURING COMPANY, LTD., Hsinchu (TW)

(72) Inventor: Te-Chih Hsiung, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 756 days.

(21) Appl. No.: 17/375,384

(22) Filed: Jul. 14, 2021

(65) Prior Publication Data

US 2022/0328359 A1 Oct. 13, 2022

Related U.S. Application Data

(60) Provisional application No. 63/172,937, filed on Apr. 9, 2021.

(51) Int. Cl.
| | |
|---|---|
| *H01L 29/66* | (2006.01) |
| *H10D 30/01* | (2025.01) |
| *H10D 30/62* | (2025.01) |
| *H10D 84/01* | (2025.01) |
| *H10D 84/03* | (2025.01) |
| *H10D 84/83* | (2025.01) |

(52) U.S. Cl.
CPC ......... *H10D 84/038* (2025.01); *H10D 30/024* (2025.01); *H10D 30/6211* (2025.01); *H10D 84/013* (2025.01); *H10D 84/0151* (2025.01); *H10D 84/0158* (2025.01); *H10D 84/834* (2025.01)

(58) Field of Classification Search
None
See application file for complete search history.

(56) References Cited

U.S. PATENT DOCUMENTS

2019/0103304 A1* 4/2019 Lin ................... H01L 29/66545
2019/0305082 A1* 10/2019 Ching ............. H01L 21/823878

* cited by examiner

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

A method for forming a semiconductor device is provided. The method includes forming first and second semiconductor fins over a semiconductor substrate; depositing a first isolation dielectric layer over the first and second semiconductor fins, the first isolation dielectric layer having a trench between the first and second semiconductor fins; depositing a second isolation dielectric layer having a first portion over a top surface of the first isolation dielectric layer and a second portion lining the trench of the first isolation dielectric layer; performing a chemical mechanical polish process to remove the first portion of the second isolation dielectric layer, while leaving the second portion of the second isolation dielectric layer to form an isolation dielectric plug between the first and second semiconductor fins; and after forming the isolation dielectric plug, forming first and second epitaxial structures over the first and second semiconductor fins.

20 Claims, 45 Drawing Sheets

SEMICONDUCTOR DEVICE AND FORMATION METHOD THEREOF

PRIORITY CLAIM AND CROSS-REFERENCE

This application claims priority to U.S. Provisional Application Ser. No. 63/172,937, filed Apr. 9, 2021, which is herein incorporated by reference.

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed in a free standing manner over a major surface of a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects. The dimensions of FinFETs and other metal oxide semiconductor field effect transistors (MOSFETs) have been progressively reduced as technological advances have been made in integrated circuit materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
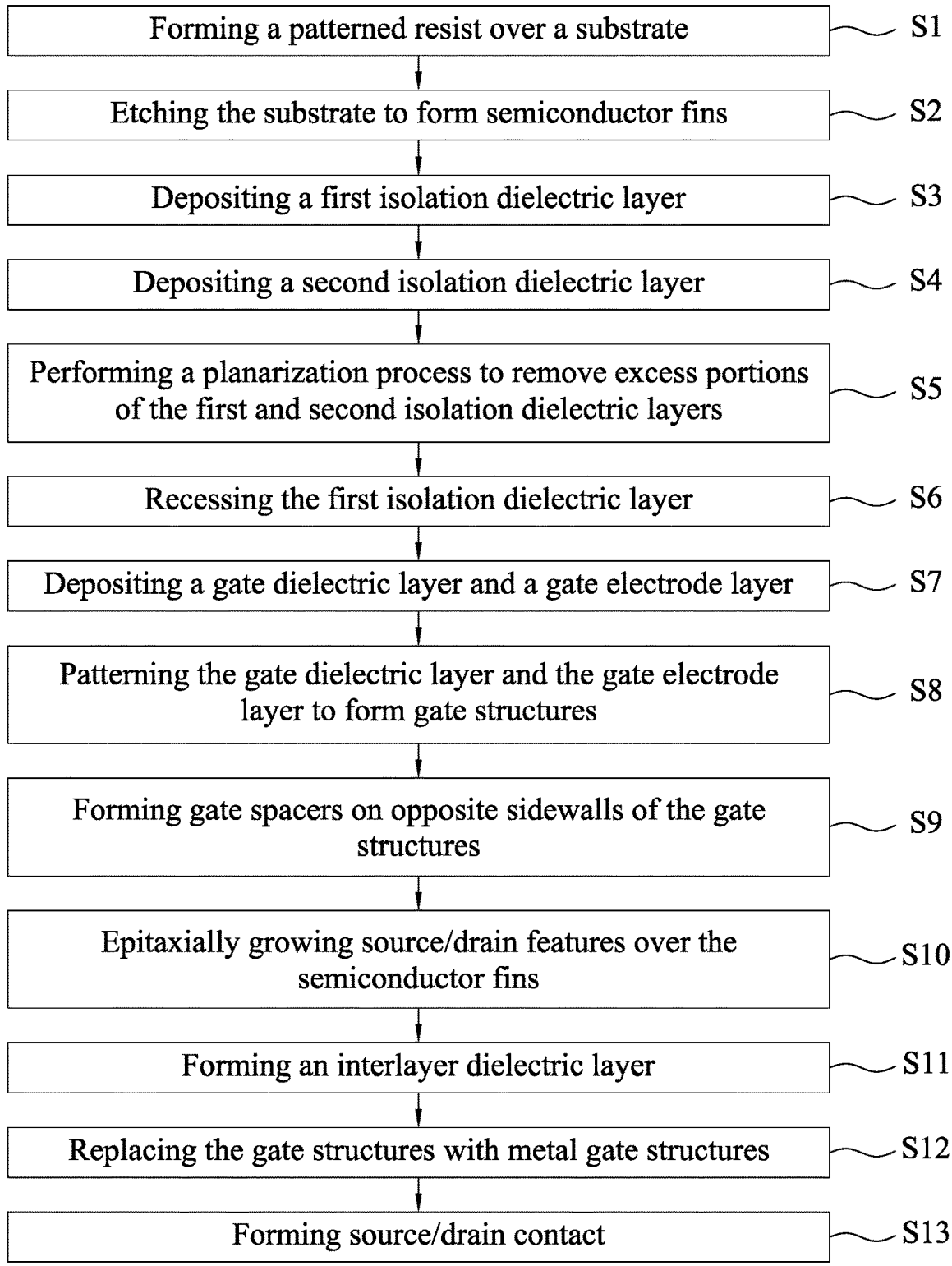
FIG. 1 is a flow chart of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 is a flow chart of a method M for manufacturing a semiconductor device at various stages in accordance with some embodiments of the present disclosure. FIGS. 2-16B illustrate the method M for manufacturing a semiconductor device at various stages in accordance with some embodiments of the present disclosure. The method M may include steps S1-S13. At step S1, a patterned resist is formed over a substrate. At step S2, the substrate is etched to form semiconductor fins. At step S3, a first isolation dielectric layer is deposited to surround the semiconductor fins. At step S4, a second isolation dielectric layer is deposited over the first isolation dielectric layer. At step S5, a planarization process is performed to remove excess portions of the first and second isolation dielectric layers. At step S6, the first isolation dielectric layer is recessed. At step S7, a gate dielectric layer and a gate electrode layer are depositing over the semiconductor fins. At step S8, the gate dielectric layer and the gate electrode layer are patterned to form gate structures. At step S9, gate spacers are formed on opposite sidewalls of the gate structures. At step S10, epitaxial source/drain structures 200 are formed over the semiconductor fins. At step S11, an interlayer dielectric (ILD) layer is formed. At step S12, the gate structures are replaced by replacement gates structures. At step S13, source/drain contacts are formed in the ILD layer. It is understood that additional steps may be provided before, during, and after the steps S1-S13 shown by FIG. 1, and some of the steps described below can be replaced or eliminated for additional embodiments of the method. The order of the operations/processes may be interchangeable.

Figure 2:
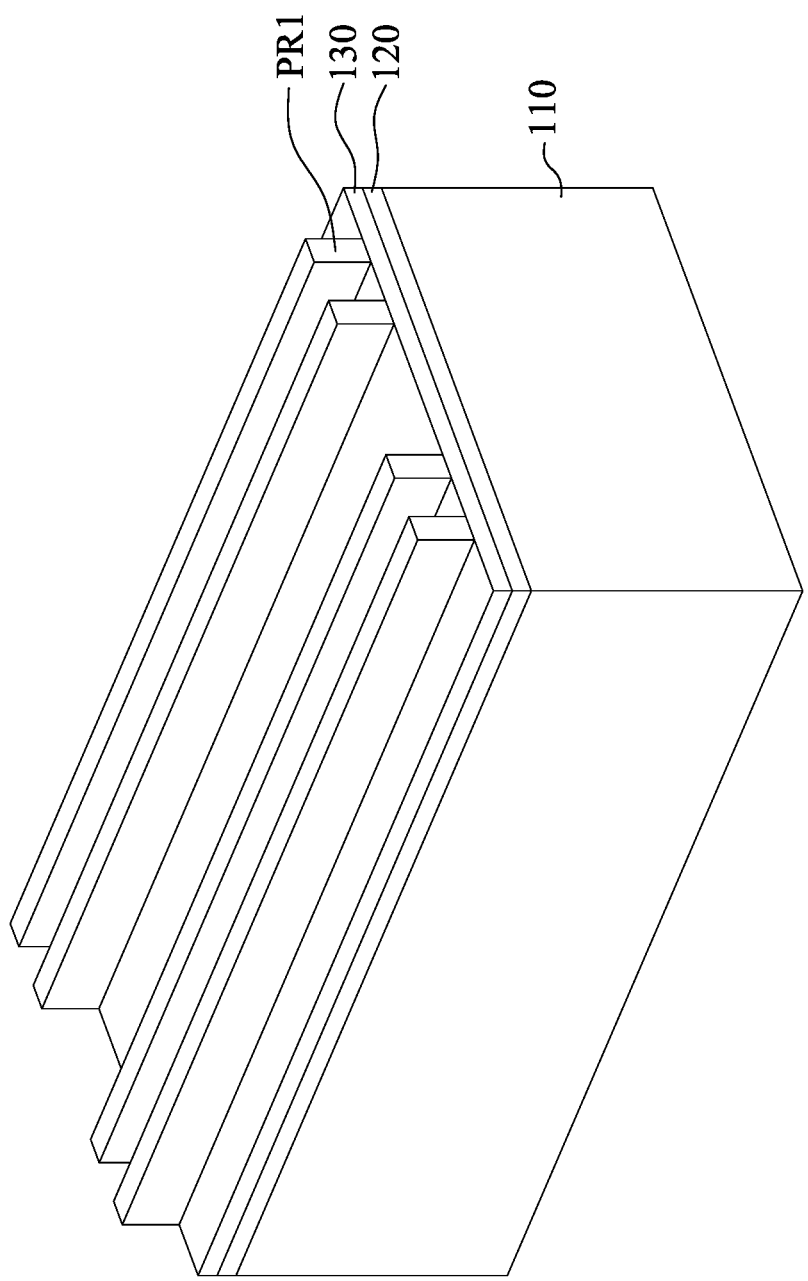
FIGS. 2-16B illustrate a method for manufacturing a semiconductor device at various stages in accordance with some embodiments of the present disclosure.

Referring to FIGS. 1 and 2, the method 100 begins at step S1, where a patterned resist PR1 is formed over a substrate 110. The substrate 110 may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, a pad layer 120 and a mask layer 130 are formed on the substrate 110. The pad layer 120 may be a thin film comprising silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD).

The patterned resist PR1 may be a photoresist mask formed over the mask layer 130 by a suitable photolithography process. For example, the photolithography process may include spin-on coating a photoresist layer over the mask layer 130, exposing the photoresist layer to patterned light, performing post-exposure bake processes, and developing the photoresist layer to form the patterned mask PM1. In some embodiments, the photolithography process forms openings in the patterned resist PR1, so that some regions of the mask layer 130 are exposed.

Figure 3A:
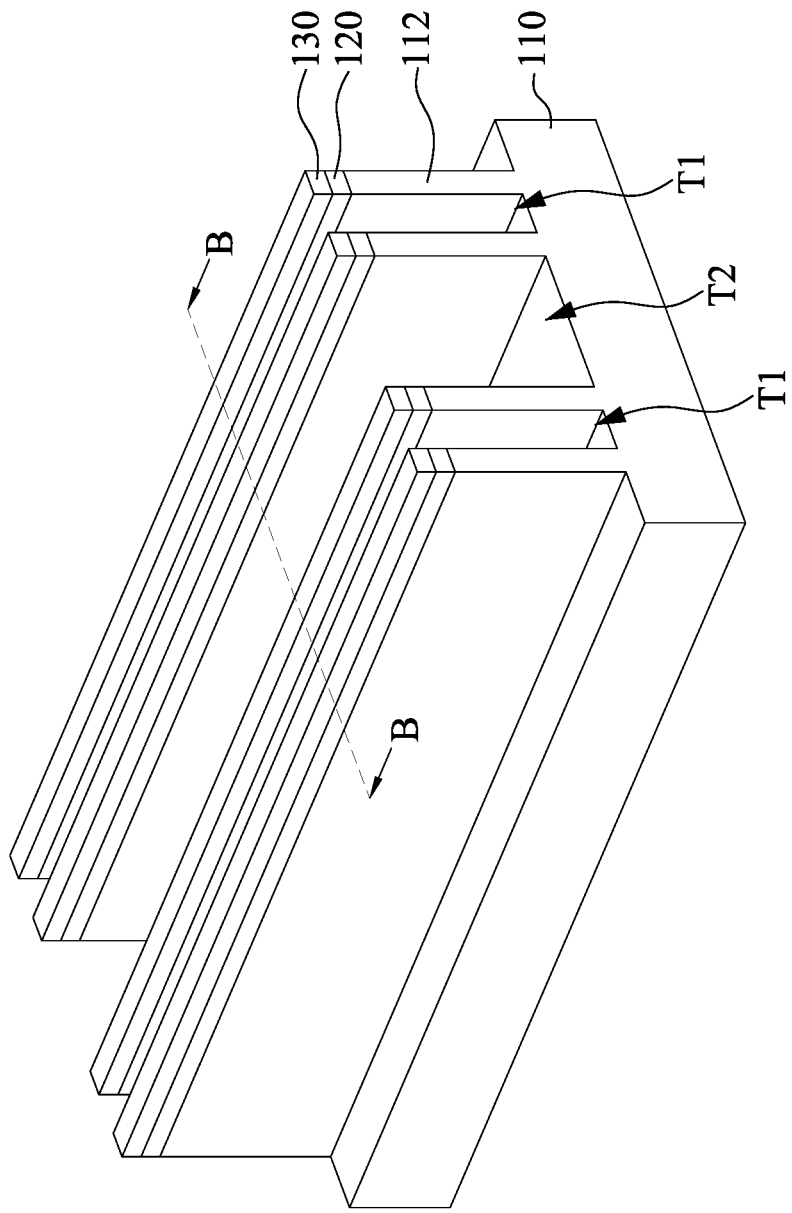
Figure 3B:
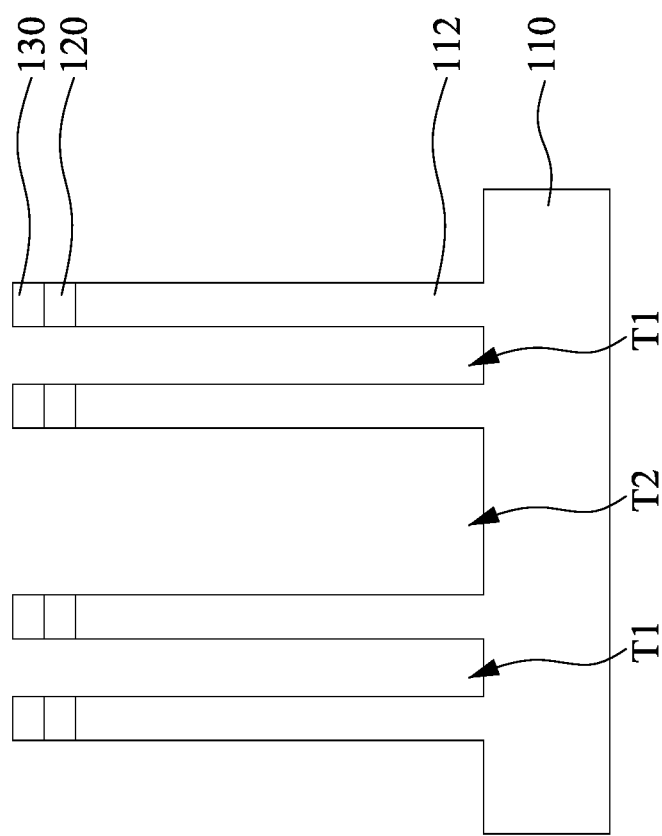

Reference is made to FIGS. 1 and 3A and 3B, in which FIG. 3B is a cross-sectional view taken along line B-B in FIG. 3A. The method 100 proceeds to step S2, where the substrate 110 is etched to form semiconductor fins 112 extending from the substrate 110. In some embodiments, the mask layer 130 and pad layer 120 are etched first through the patterned resist PR1 (referring to FIG. 2), exposing underlying substrate 110. Subsequently, the exposed substrate 110 is etched using the mask layer 130 and pad layer 120 as etch mask, thereby forming trenches T1 and T2. A portion of the substrate 110 between neighboring trenches T1 and T2 can be referred to as a semiconductor fin 112. Trenches T1 and T2 may be trench strips that are substantially parallel to each other. Similarly, the semiconductor fins 112 are substantially parallel to each other. In some embodiments, the trenches T2 is wider than the trenches T1, such that there are different pitches between the semiconductor fins 112. The patterned resist PR1 (referring to FIG. 2) may be consumed during the etching process or removed by ashing or striping process after the etching process.

Figure 4A:
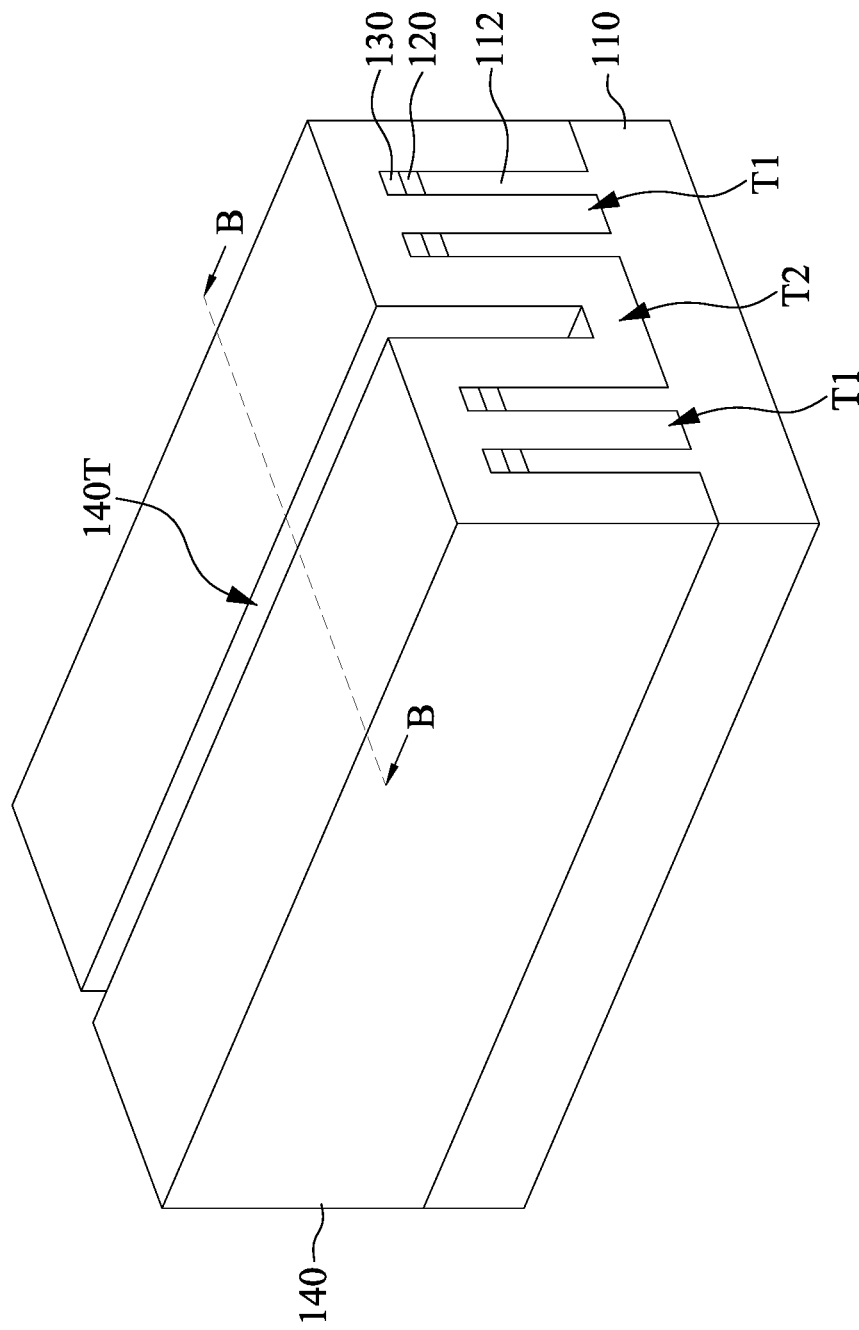
Figure 4B:
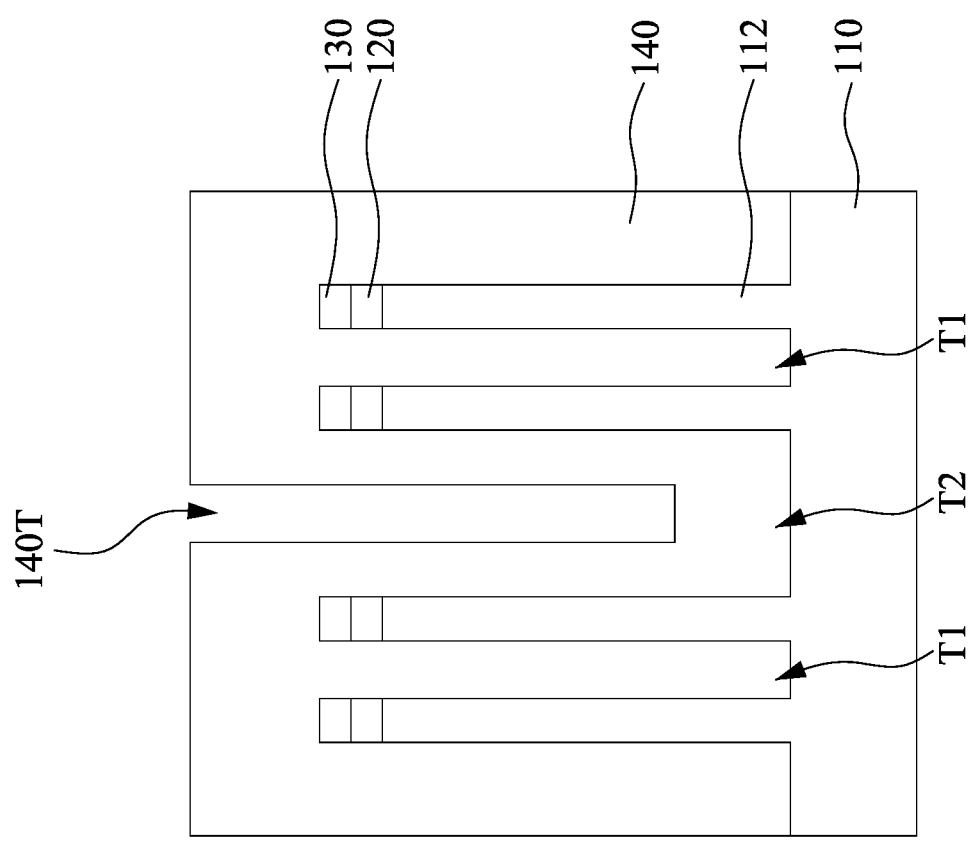

Reference is made to FIGS. 1 and 4A and 4B, in which FIG. 4B is a cross-sectional view taken along line B-B in FIG. 4A. The method 100 proceeds to step S3, where a first isolation dielectric layer 140 is deposited over the structure of FIGS. 3A and 3B. The first isolation dielectric layer 140 be conformally deposited to surround the semiconductor fins 112 and have a surface topography resulting from the semiconductor fins 112. For example, due to the width difference between the trenches T1 and T2, the first isolation dielectric layer 140 may fill up the trench T1 and line up the trench T2, while leaving an unfilled trench 140T in the trench T2. In some embodiments, the first isolation dielectric layer 140 is made of silicon oxide, silicon nitride, silicon oxynitride, or other low-k dielectric materials, the like, or the combination thereof. In the present embodiments, the first isolation dielectric layer 140 may be deposited by ALD process. In some other embodiments, the first isolation dielectric layer 140 may be deposited by PVD, CVD, other suitable conformal deposition methods, or the combination thereof. In some embodiments, the first isolation dielectric layer 140 can have a multi-layer structure, for example, having a thermal oxide liner layer and an ALD deposited oxide layer over the thermal oxide liner layer. The plural layers of the first isolation dielectric layer 140 may be deposited by atomic layer deposition (ALD), chemical vapor deposition (CVD), other suitable conformal deposition methods, or the combination thereof.

Figure 5A:
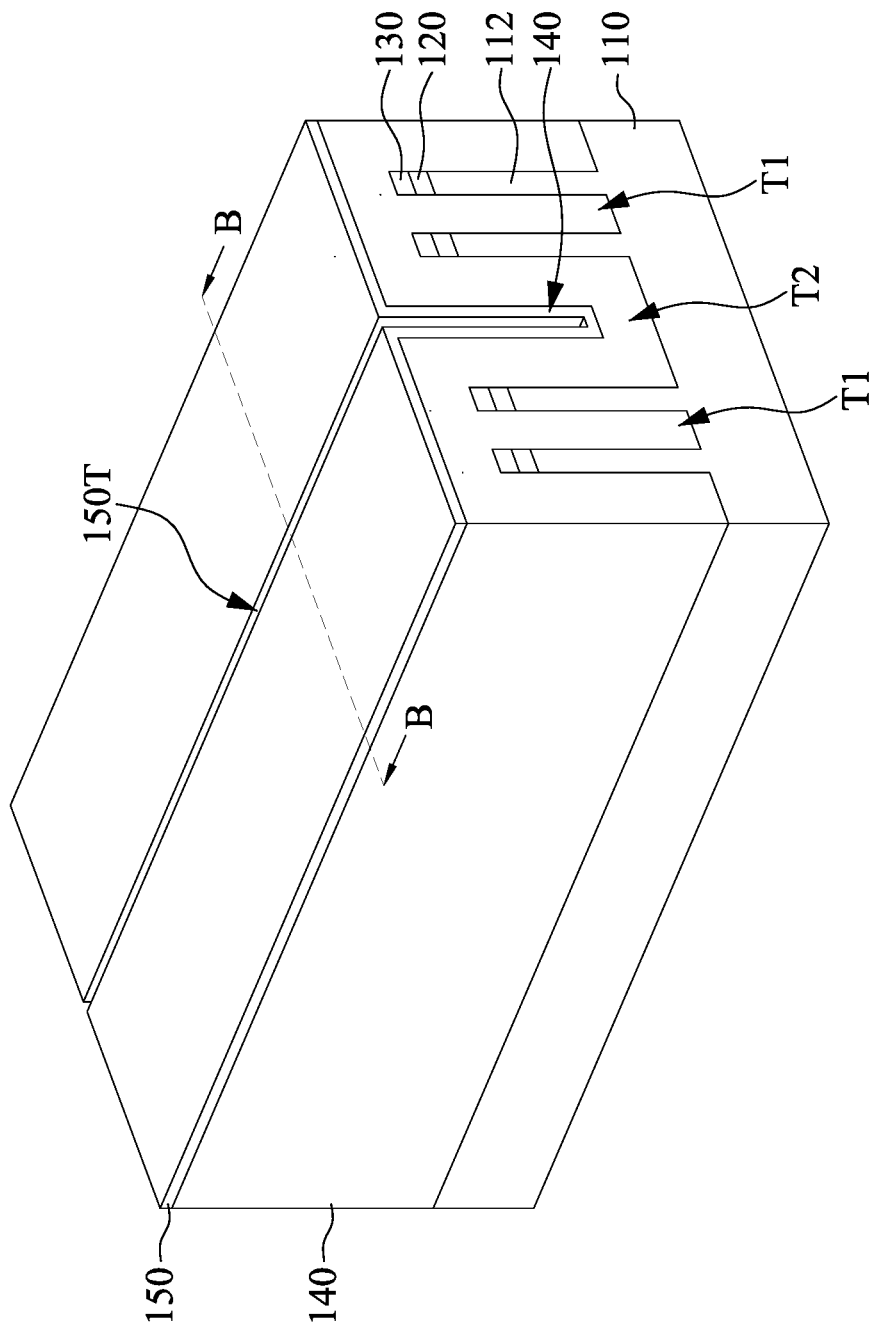
Figure 5B:
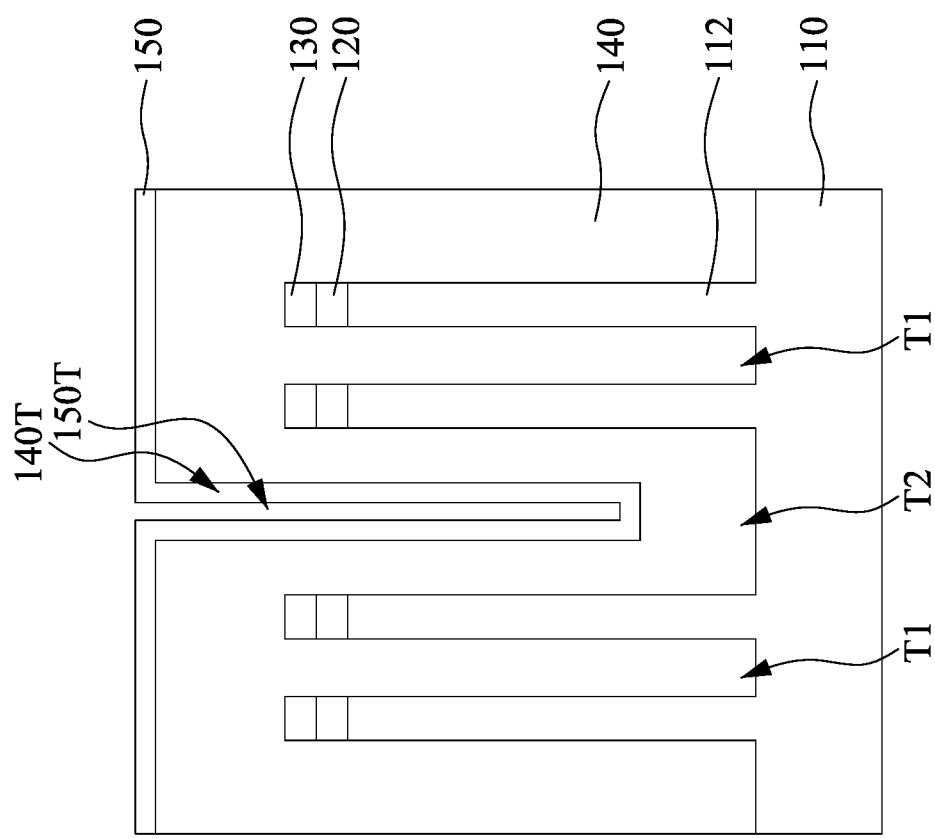

Reference is made to FIGS. 1 and 5A and 5B, in which FIG. 5B is a cross-sectional view taken along line B-B in FIG. 5A. The method 100 proceeds to step S4, where a second isolation dielectric layer 150 is deposited over the structure of FIGS. 4A and 4B. The second isolation dielectric layer 150 may be conformally deposited over the first isolation dielectric layer 140, and has a first portion over a top surface of the first isolation dielectric layer 140 and a second portion lining up the trench 140T of the first isolation dielectric layer 140, and thus have a surface topography conformal to the first isolation dielectric layer 140. For example, the second isolation dielectric layer 150 may have a trench 150T in the trench 140T of the first isolation dielectric layer 140 and between the semiconductor fins 112. The second isolation dielectric layer 150 may include a material different from that of the first isolation dielectric layer 140. For example, the second isolation dielectric layer 150 may include high-k dielectric (e.g., $HfO_x$, $ZrO_x$), silicon oxide, SiOC, SiN, SiOCN, SiCN, other material containing Si/O/C/N/H, the like, or the combination thereof. The high-k dielectric may have a high dielectric constant, for example, greater than that of thermal silicon oxide (~3.9). In the present embodiments, the second isolation dielectric layer 150 may be deposited by ALD process. In some other embodiments, the second isolation dielectric layer 150 may be deposited by ALD, CVD, other suitable conformal deposition methods, or the combination thereof. In some embodiments, the second isolation dielectric layer 150 can have a multi-layer structure, for example, having a first high-k dielectric layer and a second high-k dielectric layer over the first high-k dielectric layer. In some embodiments, the plural layers of the second isolation dielectric layer 150 may be deposited by ALD, CVD, other suitable conformal deposition methods, or the combination thereof.

Figure 6A:
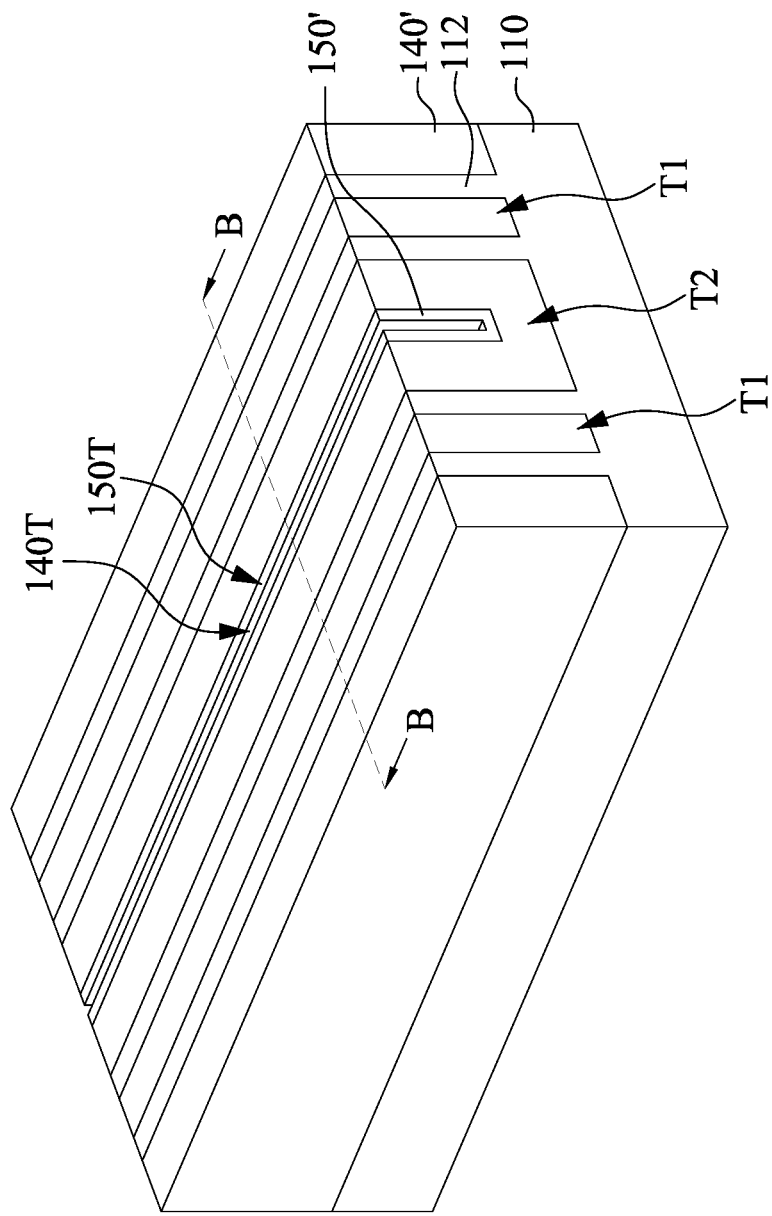
Figure 6B:
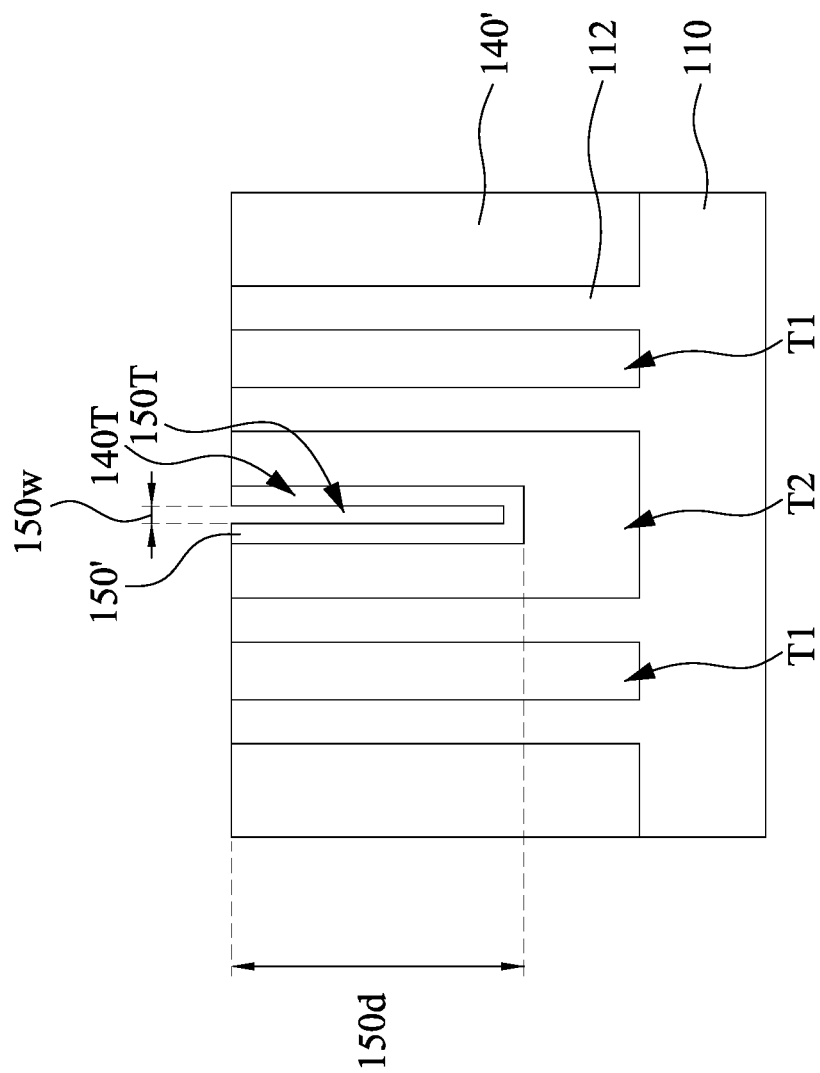

Reference is made to FIGS. 1 and 6A and 6B, in which FIG. 6B is a cross-sectional view taken along line B-B in FIG. 6A. The method 100 proceeds to step S5, where a planarization process is performed to remove excess portions of the first and second isolation dielectric layers 140 and 150 (referring to FIGS. 5A and 5B) over top ends of the semiconductor fins 112 (e.g., external to the trenches T1 and T2). The planarization process may be a chemical mechanical polish (CMP) process. In some embodiments, the planarization process is performed until the semiconductor fins 112 are exposed. For example, the planarization process may also remove the mask layer 130 and the pad layer 120 (referring to FIGS. 5A and 5B) such that top ends of the semiconductor fins 112 are exposed. In some other embodiments, the planarization process stops when the mask layer 130 (referring to FIGS. 5A and 5B) is exposed. In such embodiments, the mask layer 130 (referring to FIGS. 5A and 5B) may act as the CMP stop layer in the planarization. If the mask layer 130 and the pad layer 120 (referring to FIGS. 5A and 5B) are not removed by the planarization process, the mask layer 130 and the pad layer 120 (referring to FIGS. 5A and 5B) may be removed by a suitable etching process after the planarization process. For example, the mask layer 130 (referring to FIGS. 5A and 5B), if formed of silicon nitride, may be remove by a wet process using hot $H_3PO_4$, and the pad layer 120, if formed of silicon oxide, may be removed using diluted HF.

After the planarization process, a remaining portion of first isolation dielectric layer 140 (referring to FIGS. 5A and 5B) may be referred to as a shallow trench isolation (STI) structure 140', and a remaining portion of the second isolation dielectric layer 150 (referring to FIGS. 5A and 5B) may be referred to as isolation dielectric plug 150' embedded in the STI structure 140' and having an unfilled trench 150T. The isolation dielectric plug 150' has a U-shaped cross-section. The unfilled trench 150T in the U-shaped dielectric plug 150' has depth 150$d$ and a width 150$w$. An aspect ratio (i.e., a ratio of the depth 150$d$ to the width 150$w$) of the trench 150T is large enough to prevent subsequently deposited materials from filling up the trench 150T. Therefore, after subsequent deposition process (e.g., dummy gate materials deposition), the trench 150T in the dielectric plug 150' can remain unfilled, thus allows for reducing parasitic capacitance. In some embodiments, the aspect ratio of the trench 150T is in a range from about 1 to about 100.

Figure 7A:
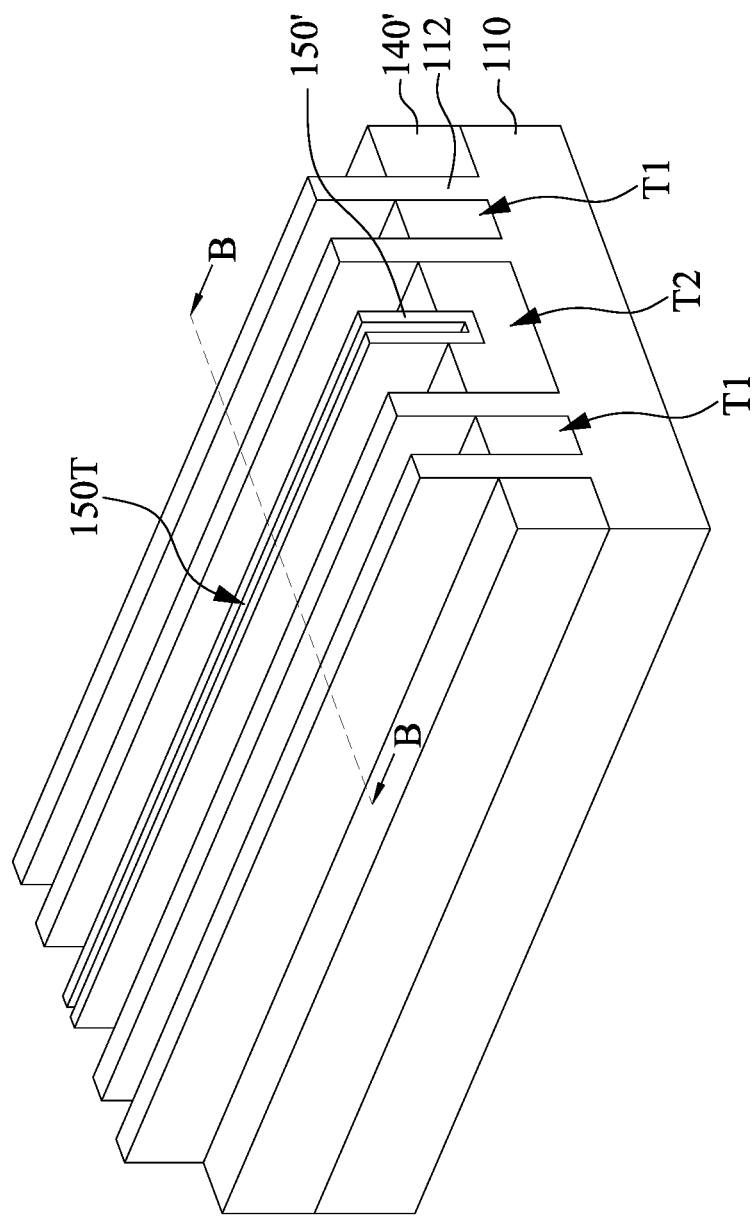
Figure 7B:
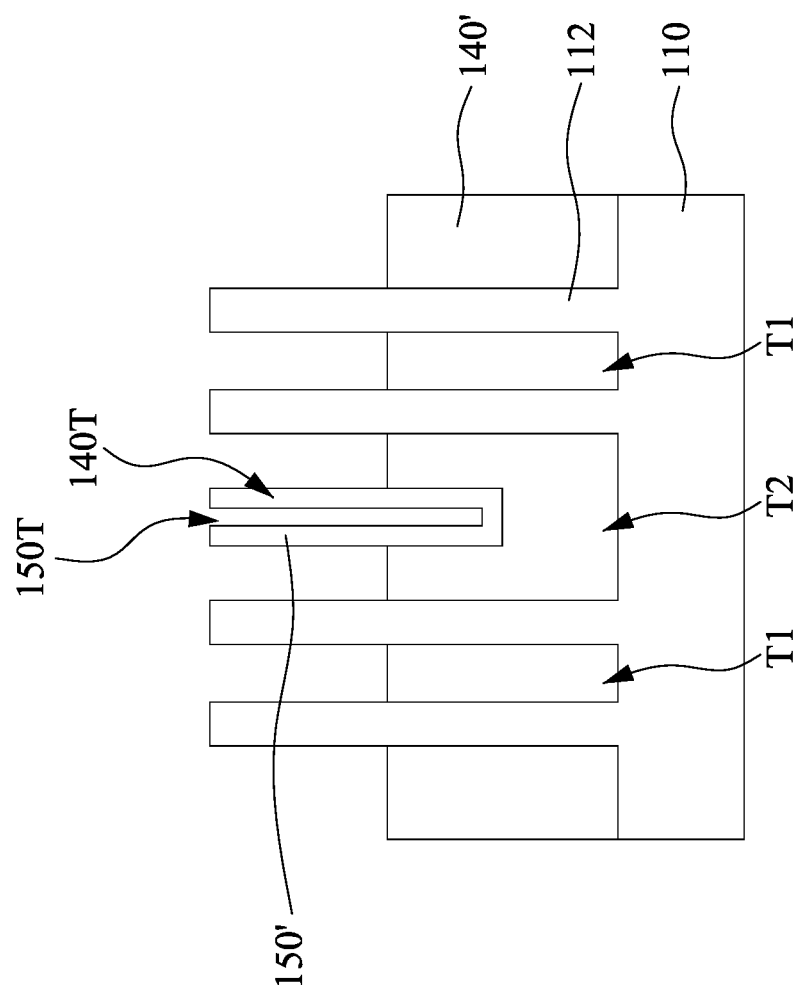

Reference is made to FIGS. 1 and 7A and 7B, in which FIG. 7B is a cross-sectional view taken along line B-B in FIG. 7A. The method 100 proceeds to step S6, the STI structure 140' (or the first isolation dielectric layer 140 in FIGS. 5A and 5B) is recessed, for example, through an etching back process. The etching back process lowers a top surface of the STI structure 140' to a position below the top ends of the semiconductor fins 112. After recessing the STI structure 140', a portion of the semiconductor fin 112 is higher than a top surface of the STI structure 140', and hence this portion of the semiconductor fin 112 protrudes above the STI structure 140'. The etching process may include dry etch, wet etch, or the combinations thereof. In some embodiments, the etching process may use an etchant that shows an etch selectivity between the isolation dielectric plug 150' and the material of the semiconductor fin 112, and thus results in a greater etch amount in the semiconductor fin 112 than in the isolation dielectric plug 150'. As a result, top ends of the isolation dielectric plug 150' may be not level with top ends of the semiconductor fins 112 after the etching back is complete. For example, the top ends of the isolation dielectric plug 150' may be higher than the top ends of the semiconductor fins 112. In some embodiments, the etching process may use an etchant that shows an etch selectivity between the isolation dielectric plug 150' and the STI structure 140'. In other words, the isolation dielectric plug 150' may have a higher etch resistance to the etching back process than that of the STI structure 140', and not be substantially etched during the recessing the STI structure 140'. Stated differently, the etching back process etches the STI structure 140' at a faster etch rate than etching the isolation dielectric plug 150'. For example, after recessing the STI structure 140', a top surface of the isolation dielectric plug 150' is higher than the lowered top surface of the STI structure 140', and hence this portion of the isolation dielectric plug 150' protrudes above the STI structure 140'. In other words, the etching process is performed to etch back the STI structure 140' to fall below top ends of the semiconductor fins 112 and a top end of the isolation dielectric plug 150'.

Figure 8A:
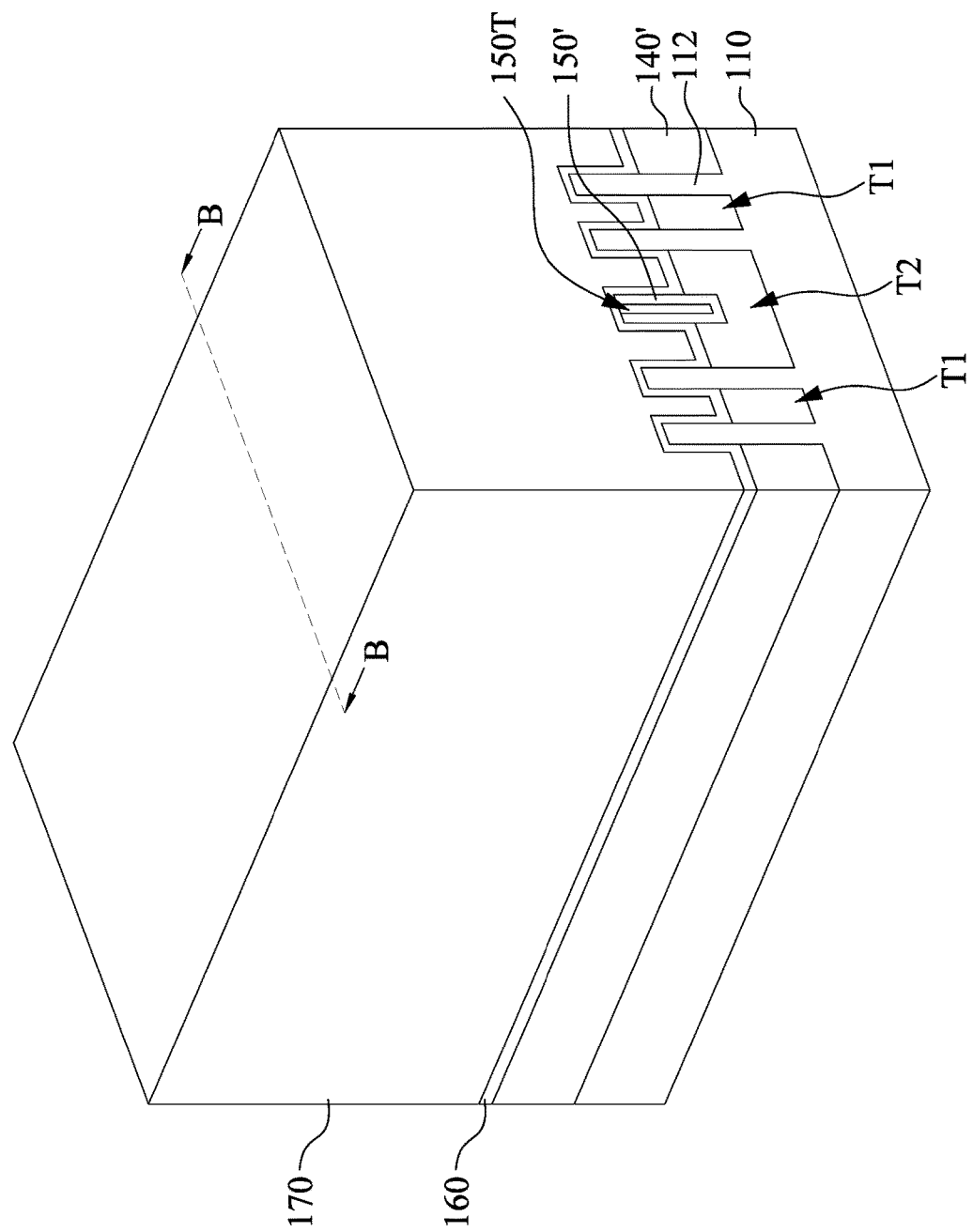
Figure 8B:
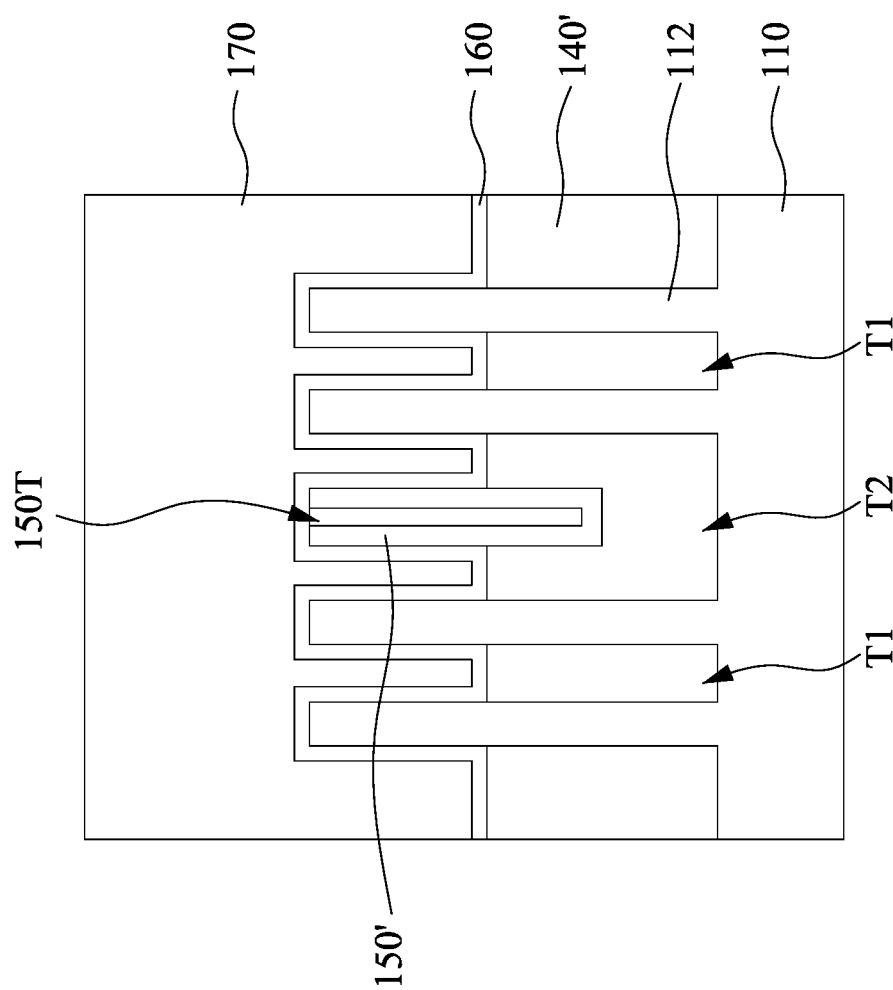

Reference is made to FIGS. 1 and 8A and 8B, in which FIG. 8B is a cross-sectional view taken along line B-B in FIG. 8A. The method 100 proceeds to step S7, where a gate dielectric layer 160 and a gate electrode layer 170 are deposited over the substrate 110.

In some embodiments, the gate dielectric layer 160 is formed over the semiconductor fins 112. In some embodiments, the gate dielectric layer 160 may be formed of a suitable dielectric material such as silicon oxide, silicon oxynitride, silicon nitride, an oxide, a nitrogen-containing oxide, aluminum oxide, lanthanum oxide, hafnium oxide, zirconium oxide, hafnium oxynitride, combinations thereof and/or the like. In some embodiments where the gate dielectric layer 160 includes oxides, the gate dielectric layer 160 may be formed by a thermal oxidation process, CVD, other suitable deposition methods, or the like.

After the gate dielectric layer 160 is formed, the gate electrode layer 170 is deposited over the gate dielectric layer 160. In some embodiments, the gate electrode layer 170 may include polycrystalline-silicon (poly-Si), poly-crystalline silicon-germanium (poly-SiGe), metallic nitrides, metallic silicides, metallic oxides, or metals. In some embodiments, the gate electrode layer 170 includes a metal-containing material such as TiN, TaN, TaC, Co, Ru, Al, combinations thereof, or multi-layers thereof. The dummy gate electrode layer 170 may be deposited by CVD, physical vapor deposition (PVD), sputter deposition, or other techniques suitable for depositing conductive materials.

In some embodiments, the trench 150T of the isolation dielectric plug 150' has an aspect ratio that is large enough to prevent materials of gate structure (e.g., materials of the gate dielectric layer 160 and the gate electrode layer 170) from filling up the trench 150T. As a result, the gate dielectric layer 160 may seal the unfilled trench 150T, thus forming a sealed air gap in the unfilled trench 150T. In some alternative embodiments, the trench 150T of the isolation dielectric plug 150' may be filled with materials of gate structure (e.g., materials of the gate dielectric layer 160 and the gate electrode layer 170).

Figure 9:
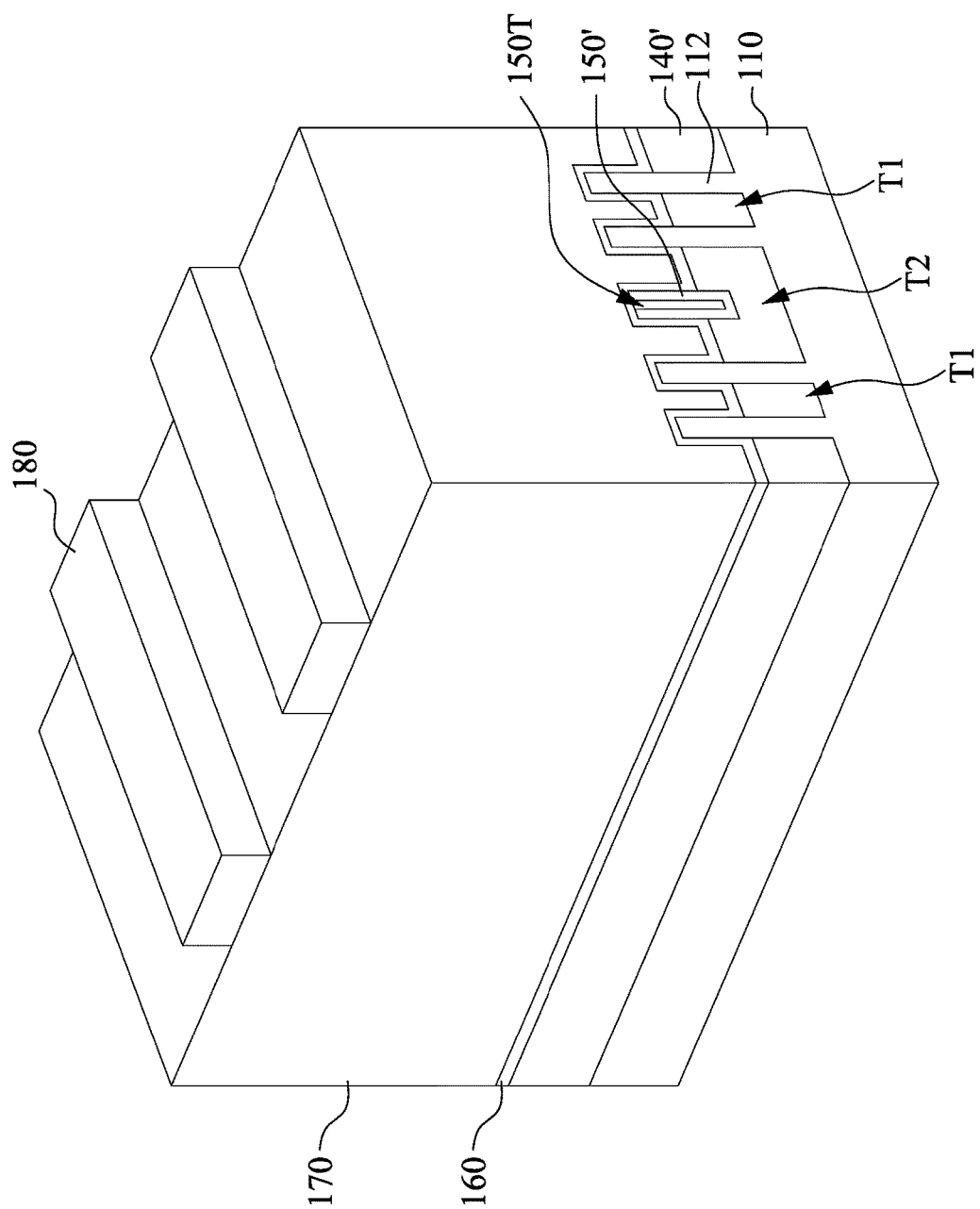

Reference is made to FIG. 1. The method 100 proceeds to step S8, where the gate electrode layer 170 and the gate dielectric layer 160 are patterned to form gate structures in accordance with some embodiments. For example, a patterned mask 180 is formed over a portion of the gate electrode layer 170, as shown in FIG. 9. The mask 180 may be a hard mask for protecting the underlying dummy gate electrode layer 170 and the gate dielectric layer 160 against subsequent etching process. The patterned mask 180 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 10:
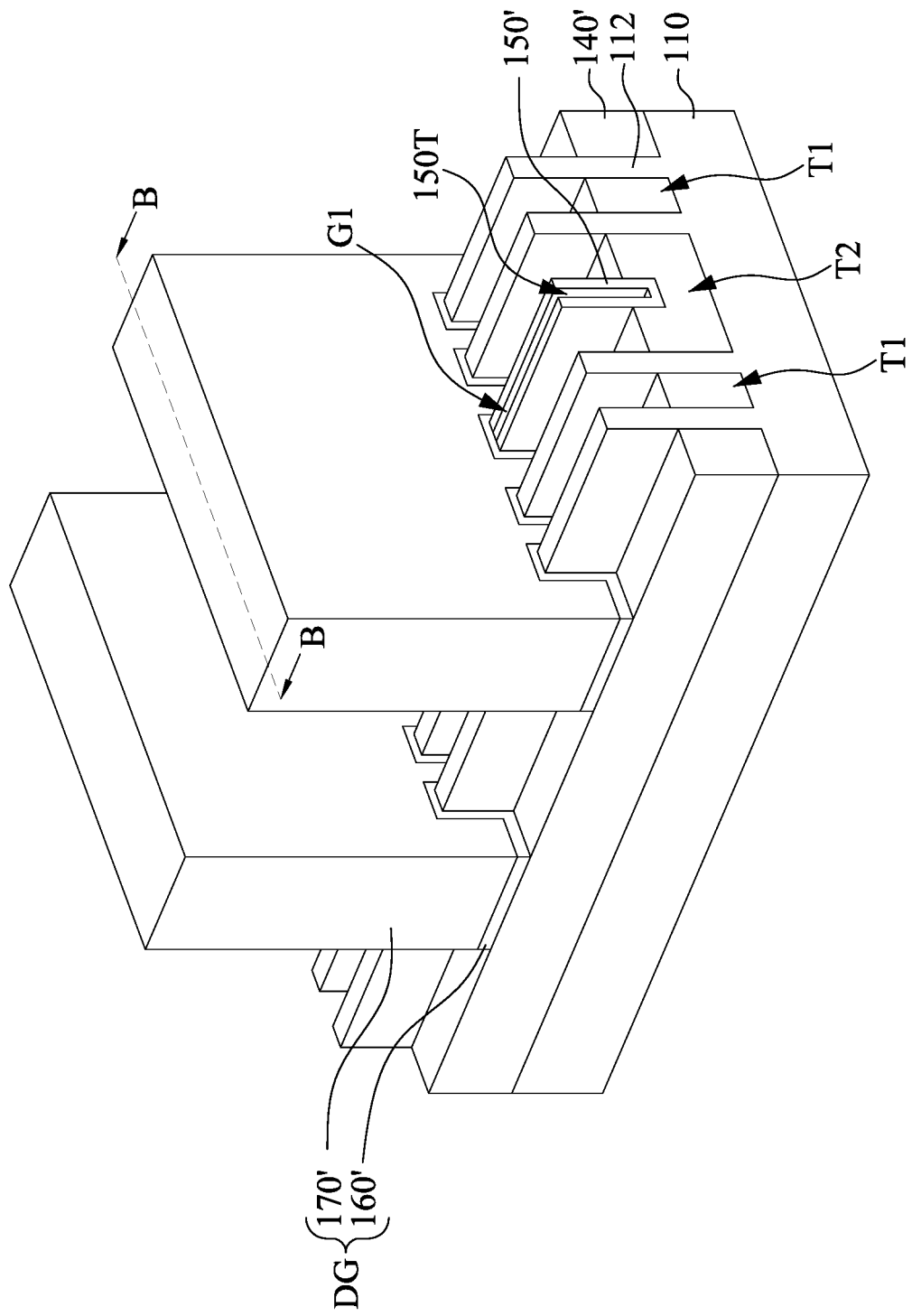

One or more etching processes are performed to form gate structures DG wrapping the semiconductor fins 112 using the patterned mask 180 as an etching mask, and the patterned mask 180 is removed after the etching. The resulting structure is shown in FIG. 10. Each gate structure DG includes a gate dielectric 160' and a gate electrode 170' over the gate dielectric 160' by a suitable etching process. The gate electrode 170' and the gate dielectric 160' may be respectively patterned from the gate electrode layer 170 and the gate dielectric layer 160 in FIG. 9. The gate structures DG have substantially parallel longitudinal axes that are substantially perpendicular to longitudinal axes of the semiconductor fins 112. In some embodiments, portions of the semiconductor fins 112 covered by the gate structure DG may be referred to as channel regions of the semiconductor fins 112. In some embodiments, the gate structures DG will be replaced with a replacement gate structure using a "gate-last" or replacement-gate process, and thus the gate structures DG may be referred to as dummy gate structures.

In the present embodiments, the gate structure DG may cover a portion of the trench 150T of the isolation dielectric plug 150', and thus a gap G1 is retained between the isolation dielectric plug 150' and the gate structure DG. In some embodiments, the gap G1 is an air gap void of any solid material. In some alternative embodiments, the gap G1 may be partially or entirely filled with some dielectric material that is deposited during aforementioned one or more processes. The air or dielectric materials in the gap G1 may have a lower dielectric constant than that of the materials of the isolation dielectric plug 150' (e.g., high-k dielectric materials), and thus the air gap G1 in the isolation dielectric plug 150' is beneficial for reducing parasitic capacitance.

Figure 11A:
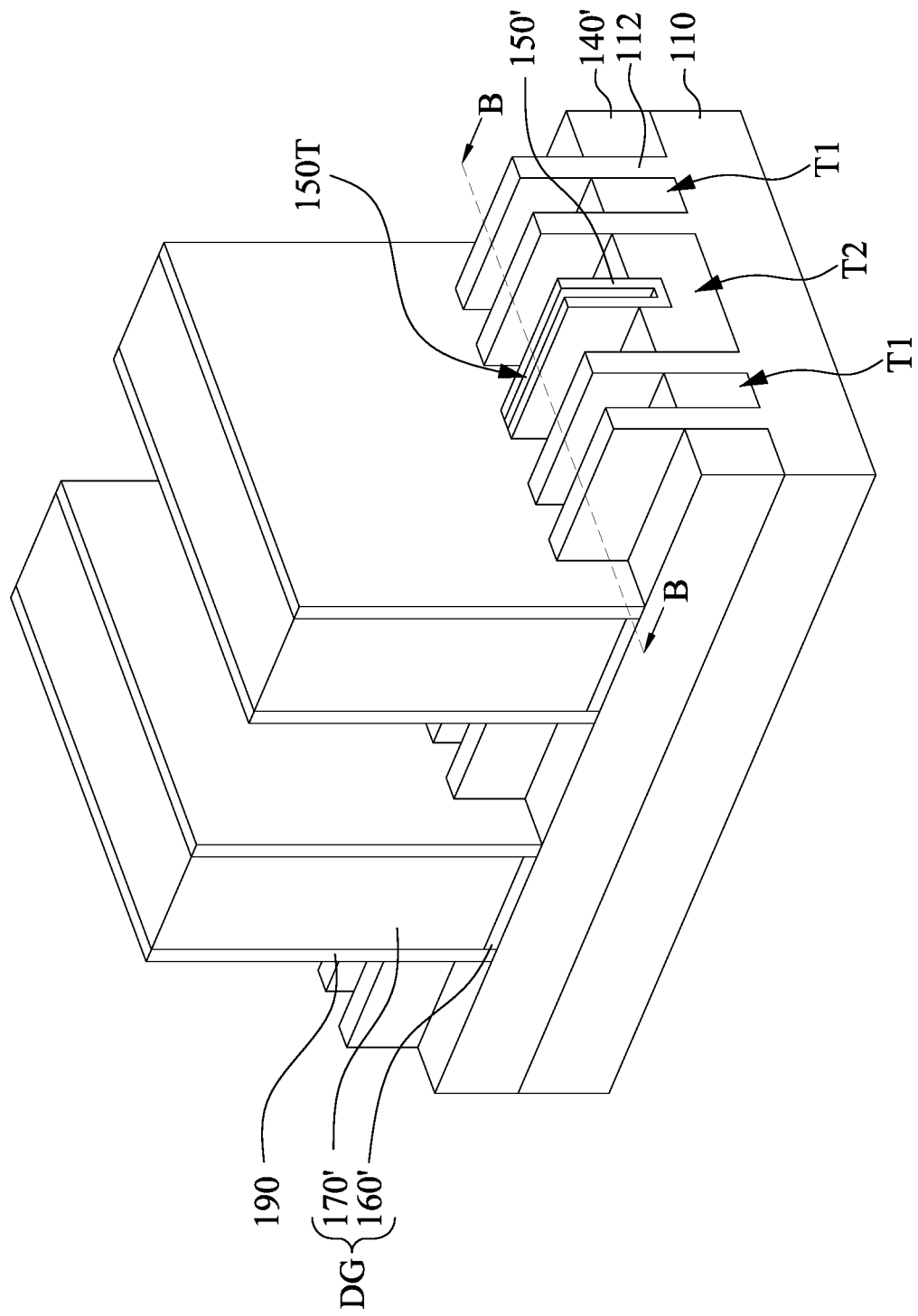
Figure 11B:
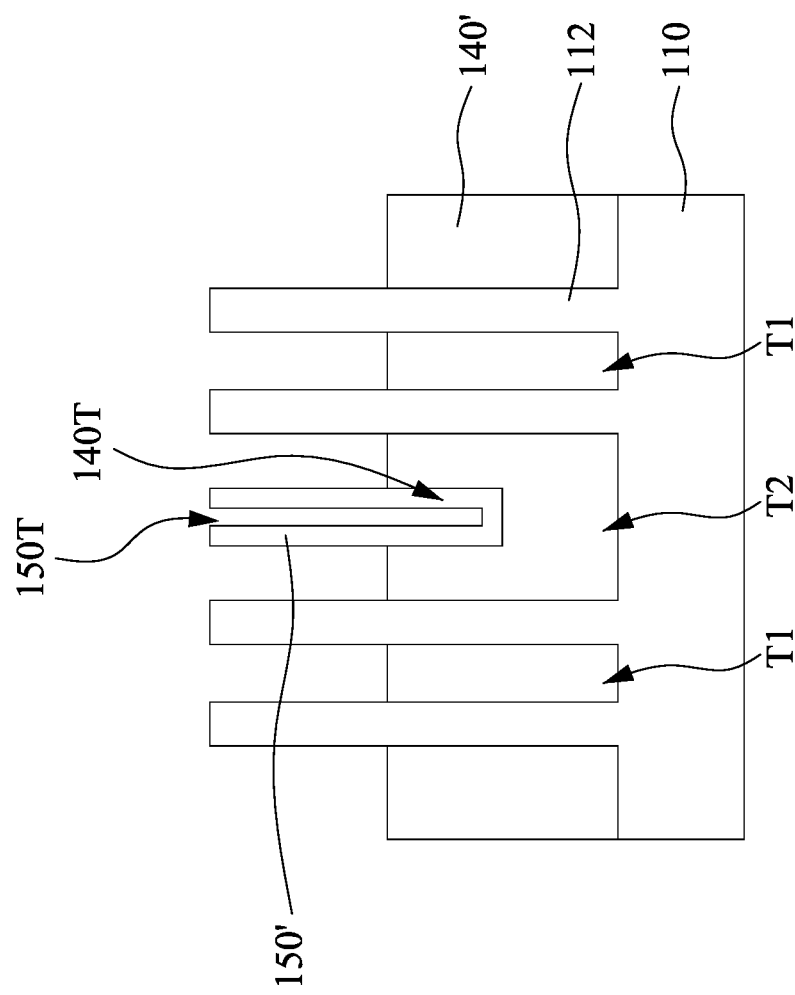

Reference is made to FIGS. 1 and FIGS. 11A and 11B, in which FIG. 11B is a cross-sectional view taken along line B-B in FIG. 11A. The method 100 proceeds to step S9, where gate spacers 190 are formed on opposite sidewalls of the gate structures DG. In some embodiments, the gate spacers 190 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 190 may include a single layer or multilayer structure made of different dielectric materials. The method of forming the gate spacers 190 includes blanket forming a dielectric layer on the structure shown in FIG. 10 using, for example, CVD, PVD or ALD, and then performing an etching process such as anisotropic etching to remove horizontal portions of the dielectric layer. The remaining portions of the dielectric layer on sidewalls of the gate structures DG can serve as the gate spacers 190. In some embodiments, the gate spacers 190 may be used to offset subsequently formed doped regions, such as source/drain regions. The gate spacers 190 may further be used for designing or modifying the source/drain region profile.

Figure 12:
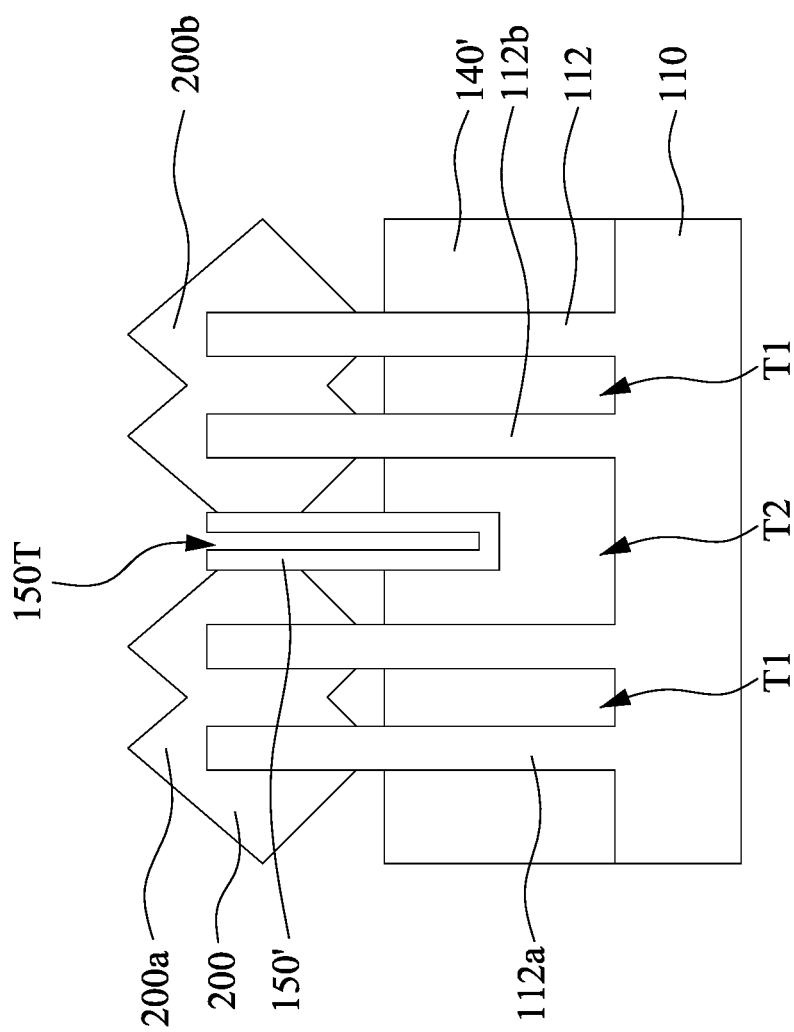

Reference is made to FIGS. 1 and 12. The method 100 proceeds to step S10, where epitaxial source/drain structures 200 are respectively formed over portions of the semiconductor fins 112 not covered by the gate structures DG. The epitaxial source/drain structures 200 may be formed using one or more epitaxy or epitaxial (epi) processes, such that Si features, SiGe features, silicon phosphate (SiP) features, silicon carbide (SiC) features and/or other suitable features can be epitaxially grown in a crystalline state from the exposed portions of the semiconductor fins 112, and thus the exposed semiconductor fins 112 are wrapped by the epitaxial source/drain structures 200.

In the present embodiments, the epitaxial source/drain structures 200 may be formed on the portions of the semiconductor fins 112 uncovered by the gate structure DG, without recessing the portions of the semiconductor fins 112 uncovered by the gate structure DG. In other words, the top ends of portions of the semiconductor fins 112 below the epitaxial source/drain structures 200 may be substantially at the same height as the top ends of portions of the semiconductor fins 112 covered by the gate structure DG. As a result, in the present embodiments, the epitaxial source/drain structures 200 are grown form the top surfaces and sidewalls of the semiconductor fins 112. In some alternative embodiments, prior to forming the epitaxial source/drain structures 200, the semiconductor fins 112 uncovered by the gate structure DG may be recessed. By the recessing process, top surfaces of portions of the semiconductor fins 112 uncovered by the gate structure DG are etched back to be lower than top surfaces of portions of the semiconductor fins 112 covered by the gate structure DG. The epitaxial source/drain structures 200 may be formed on the recessed portions of the semiconductor fins 112.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112 (e.g., silicon, silicon germanium, silicon phosphate, or the like). The epitaxial source/drain structures 200 may be in-situ doped. The doping species include p-type dopants, such as boron or $BF_2$; n-type dopants, such as phosphorus or arsenic; and/or other suitable dopants including combinations thereof. If the epitaxial source/drain structures 200 are not in-situ doped, a second implantation process (i.e., a junction implant process) is performed to dope the epitaxial source/drain structures 200. One or more annealing processes may be performed to activate the epitaxial source/drain structures 200. The annealing processes include rapid thermal annealing (RTA) and/or laser annealing processes.

In some embodiments, one or more epitaxy conditions (e.g., epitaxial growth duration, and/or the flow rates of the gases used in the epitaxial growth) are controlled in such a way that epitaxial materials respectively grown from neighboring semiconductor fins 112 that are spaced apart from each other by the trench T1 are merged. In this way, neighboring semiconductor fins 112 can be wrapped by a single continuous epitaxial source/drain structure 200, which in turn results in improved source/drain contact area and reduced source/drain contact resistance.

For better illustration, the semiconductor fins 112 are labelled as fins 112a and 112b, in which the fins 112a are spaced apart from each other by the trench T1, the fins 112b are spaced apart from each other by the trench T1, and one of the fins 112a adjacent to the fins 112b is spaced apart from one of the fins 112b adjacent to fins 112a by the trench T2.

Also, the epitaxial source/drain structure 200 over the fins 112a is labelled as epitaxial source/drain structure 200a, and the epitaxial source/drain structure 200 over the fins 112b is labelled as epitaxial source/drain structure 200b.

For achieving low electrical resistance, during the epitaxy process, sizes of the epitaxial source/drain structures 200a and 200b grown on the semiconductor fins 112a and 112b may be enlarged. In absence of the isolation dielectric plug 150', the epitaxial source/drain structures 200a and 200b may touch each other. For example, epitaxial materials respectively grown from the one of the fins 112a adjacent to the fins 112b and the one of the fins 112b adjacent to fins 112a may become merged. The merged epitaxial source/drain structures 200a and 200b may form a single continuous epitaxial structure, which may be unsatisfactory for some integrated circuits, for example, having the epitaxial source/drain structures 200a and 200b at different voltages.

In some embodiments of the present disclosure, with the isolation dielectric plug 150' located in the trench T2 between the fins 112a and 112b, during the epitaxy process, the epitaxial source/drain structure 200a can be spaced apart from the epitaxial source/drain structure 200b by the isolation dielectric plug 150'. For example, the epitaxial source/drain structure 200a and 200b are in contact with opposite sides of the isolation dielectric plug 150'. Sizes of the epitaxial source/drain structures 200a and 200b epitaxially grown on the semiconductor fins 112 can be enlarged without touching each other, thereby lowering electrical resistance. The configuration may be beneficial for some integrated circuits, for example, having the epitaxial source/drain structures 200a and 200b at different voltages.

Figure 13:
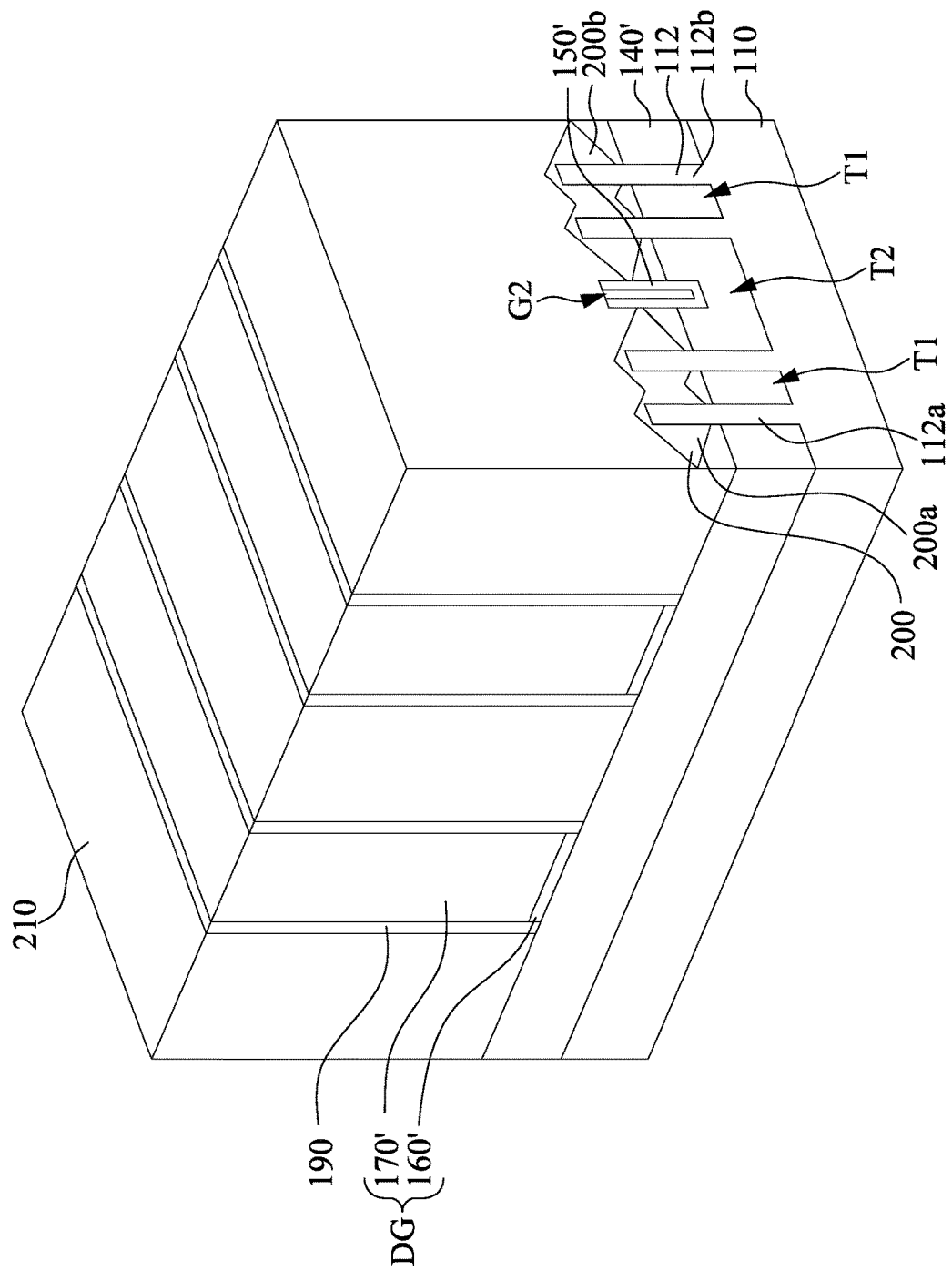

Reference is made to FIGS. 1 and 13. The method 100 proceeds to step S11, where an interlayer dielectric (ILD) layer 210 is formed on the structure shown in FIG. 12. Afterwards, a CMP process may be optionally performed to remove excessive material of the ILD layer 210 to expose the gate structures DG. The CMP process may planarize a top surface of the ILD layer 210 with top surfaces of the gate structures DG, and the gate spacers 190. In some embodiments, the ILD layer 210 may include silicon oxide, silicon nitride, silicon oxynitride, tetraethoxysilane (TEOS) oxide, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 210 may be formed using, for example, CVD, ALD, spin-on-glass (SOG) or other suitable techniques.

In some embodiments, a contact etch stop layer (CESL) may be optionally blanket formed on the structure shown in FIG. 12, and then the ILD layer 210 is formed over the CESL layer. That is, there is a CESL between the epitaxial source/drain structures 200 and the ILD layer 210, the STI structure 140' and the ILD layer 210, and between the isolation dielectric plug 150' and the ILD layer 210. The CESL may include a material different from the ILD layer 210. The CESL includes silicon nitride, silicon oxynitride or other suitable materials. The CESL can be formed using, for example, plasma enhanced CVD, low pressure CVD, ALD or other suitable techniques.

In the present embodiments, the ILD layer 210 may cover the trench 150T of the isolation dielectric plug 150', and thus a gap G2 is retained between the isolation dielectric plug 150' and the ILD layer 210. In some embodiments, the gap G2 is an air gap void of any solid material. In some alternative embodiments, the gap G2 may be partially or entirely filled with some dielectric material that is deposited during aforementioned one or more processes. The air or dielectric materials in the gap G2 may have a lower dielectric constant than that of the materials of the isolation dielectric plug 150' (e.g., high-k dielectric materials), and thus the configuration of the gap G2 in the isolation dielectric plug 150' is beneficial for achieving low parasitic capacitance. In some embodiments, the gap G2 may be in gaseous communication with the gap G1 (referring to FIG. 10) below the gate structure DG. In other word, the isolation dielectric plug 150' may have a gap with portions (e.g., the gaps G1 in FIG. 10) below the gate structure DG, portions below the gate spacers 190 (referring to FIGS. 11A and 11B), and portions below the ILD layer 210 (e.g., the gaps G2).

Figure 14A:
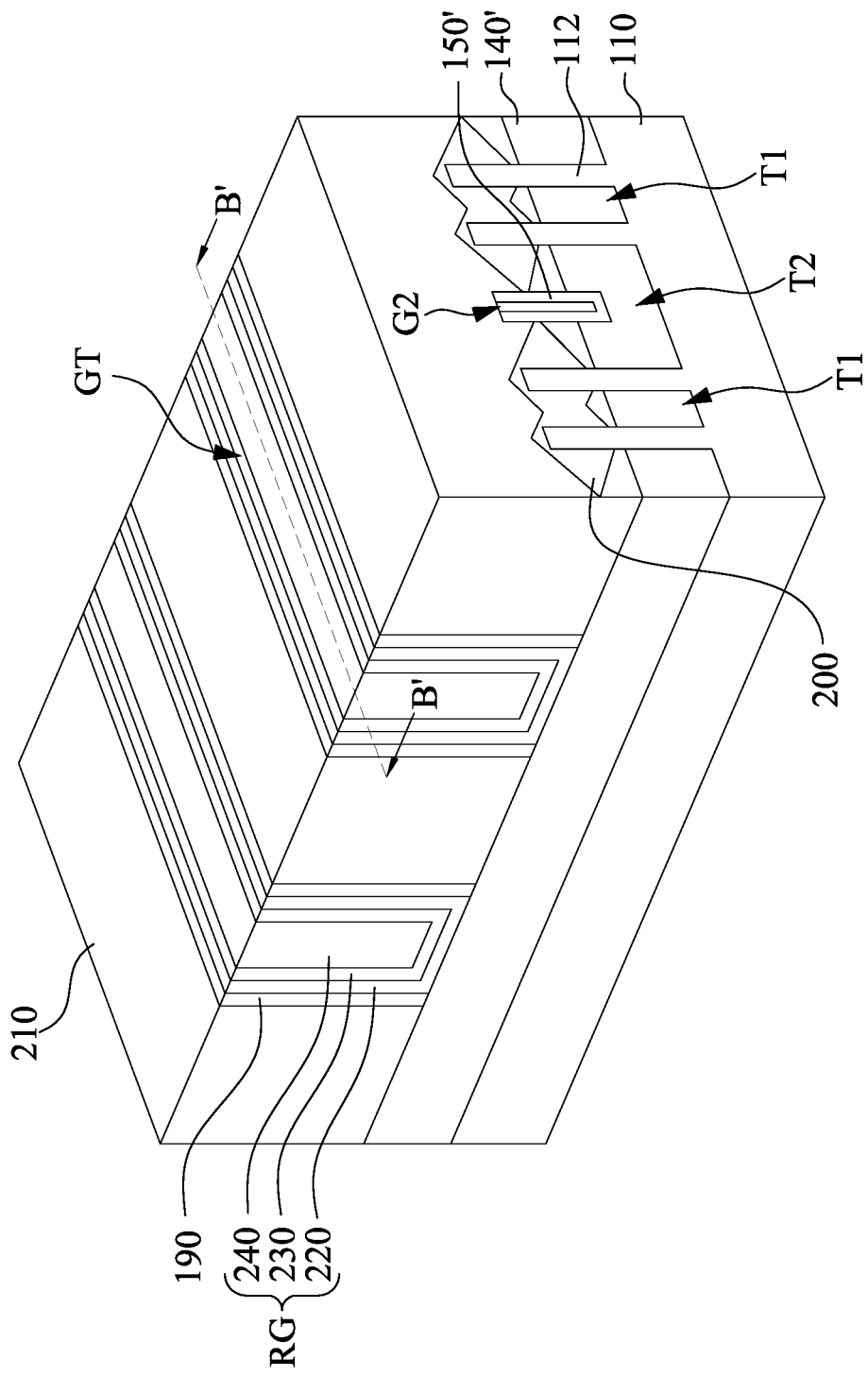

Reference is made to FIGS. 1 and 14A. The method 100 proceeds to step S12, where the gate structures DG (referring to FIG. 13) are replaced by replacement gates structures RG. In the present embodiments, at least the gate electrode 170' of the gate structures DG (referring to FIG. 13) is removed to leave gate trenches GT between the gate spacers 190, and then the replacement gates structures RG are formed in the gate trenches. In some embodiments, both the gate electrode 170' and the gate dielectric 160' of the gate structures DG (referring to FIG. 13) are removed to leave gate trenches GT between the gate spacers 190, and then the replacement gates structures RG are formed in the gate trenches GT. The replacement gates structures RG may include a gate dielectric layer 220, a work function metal layer 230, and a fill metal 240. Formation of the gate structures RG may include depositing the gate dielectric layer 220 over the ILD layer 210 and into the gate trenches GT, depositing the work function metal layer 230 over the gate dielectric layer 220, and filling the gate trenches with the fill metal 240. After the deposition of these gate materials, a CMP process is performed to remove excessive gate materials external to the gate trench, thereby forming the gate structures RG.

In some embodiments, the gate dielectric layer 220 may include an interfacial layer and a high-k gate dielectric layer over the interfacial layer. The interfacial layer may be a silicon oxide layer. The high-k dielectric layer may include dielectric materials having a high dielectric constant, for example, greater than that of thermal silicon oxide (~3.9). For example, the high-k dielectric layer 224 may include hafnium oxide ($HfO_2$). Alternatively, the high-k dielectric layer 224 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

In some embodiments, the work function metal layer 230 includes work function metals to provide a suitable work function for the conductive metal. In some embodiments, the work function metal layer 230 may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function metal layer 230 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the work function metal layer 230 is formed by ALD process. The fill metal 240 may include, for example, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 14B:
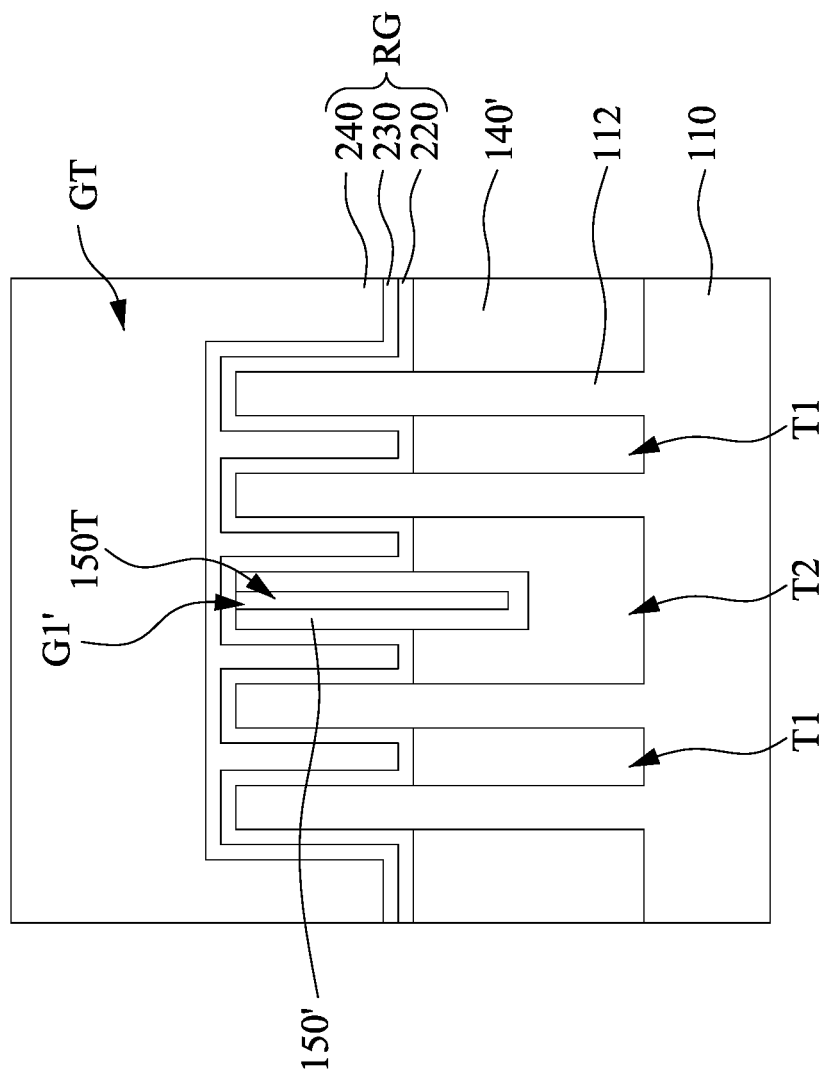
Figure 15:
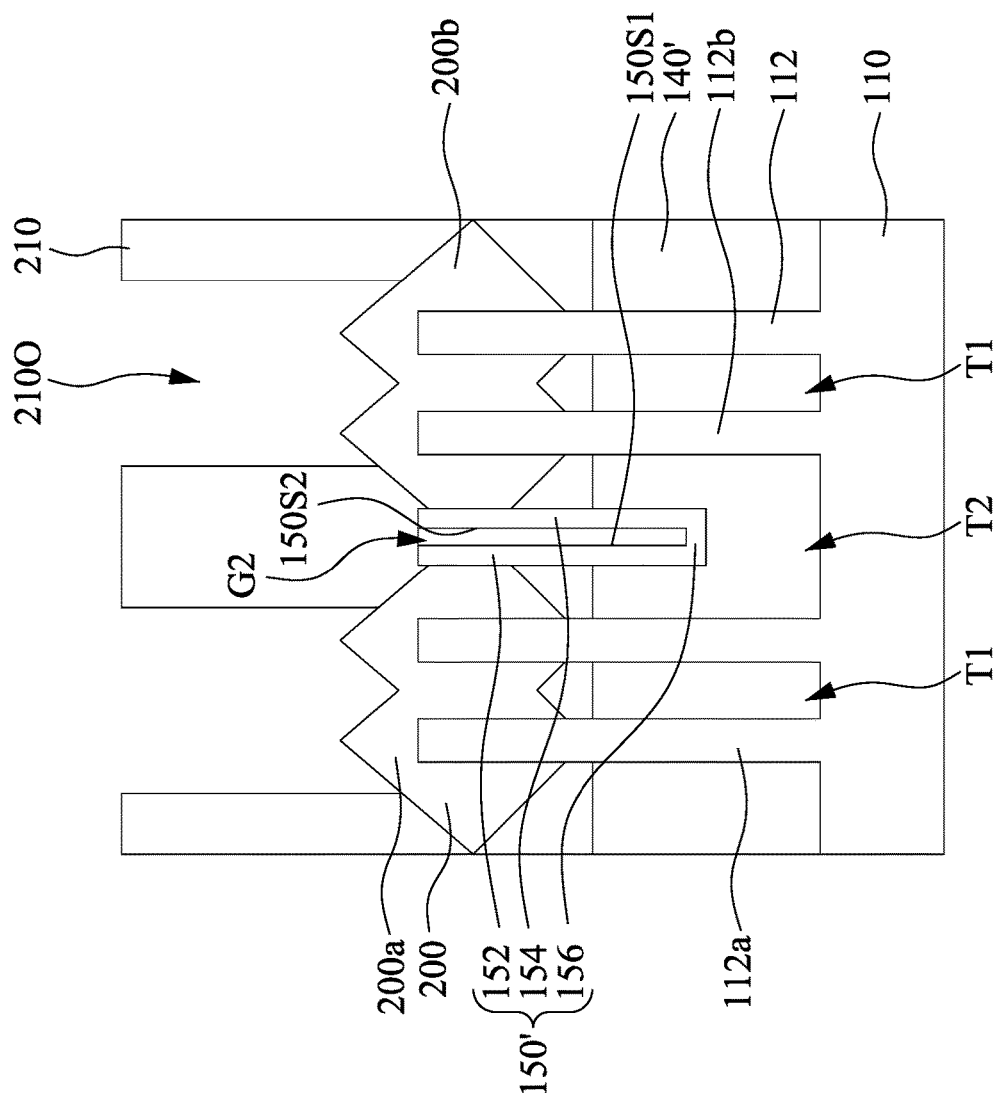

FIG. 14B is a cross-sectional view taken long line B'-B' in FIG. 14A. In some embodiments, during the gate replacement process, the removal of the gate structures DG may leave top ends of the isolation dielectric plug 150' exposed by the gate trench GT. In some further embodiments, the trench 150T of the isolation dielectric plug 150' may be exposed by the gate trench GT. The gate dielectric layer 220 may be deposited to cover the top ends of the isolation dielectric plug 150' and seal the trench 150T, without filling up the trench 150T, because the trench 150T has a high aspect ratio. Thus, after the gate replacement process, a gap G1' may be retained between the isolation dielectric plug 150' and the gate dielectric layer 220. In some embodiments, the gap G1' is an air gap void of any solid material. In some alternative embodiments, the gap G1' may be partially or entirely filled with some dielectric material that is deposited during aforementioned one or more processes. The air or dielectric materials in the gap G1' may have a lower dielectric constant than that of the materials of the isolation dielectric plug 150' (e.g., high-k dielectric materials), and thus the configuration of the gap G1' in the isolation dielectric plug 150' is beneficial for achieving low parasitic capacitance. In other words, the isolation dielectric plug 150' may have a gap with portions (e.g., the gaps G1') below the gate dielectric layer 220, portions below the gate spacers 190 (referring to FIGS. 11A and 11B), and portions below the ILD layer 210 (e.g., the gaps G2 in FIG. 14A).

Figure 16A:
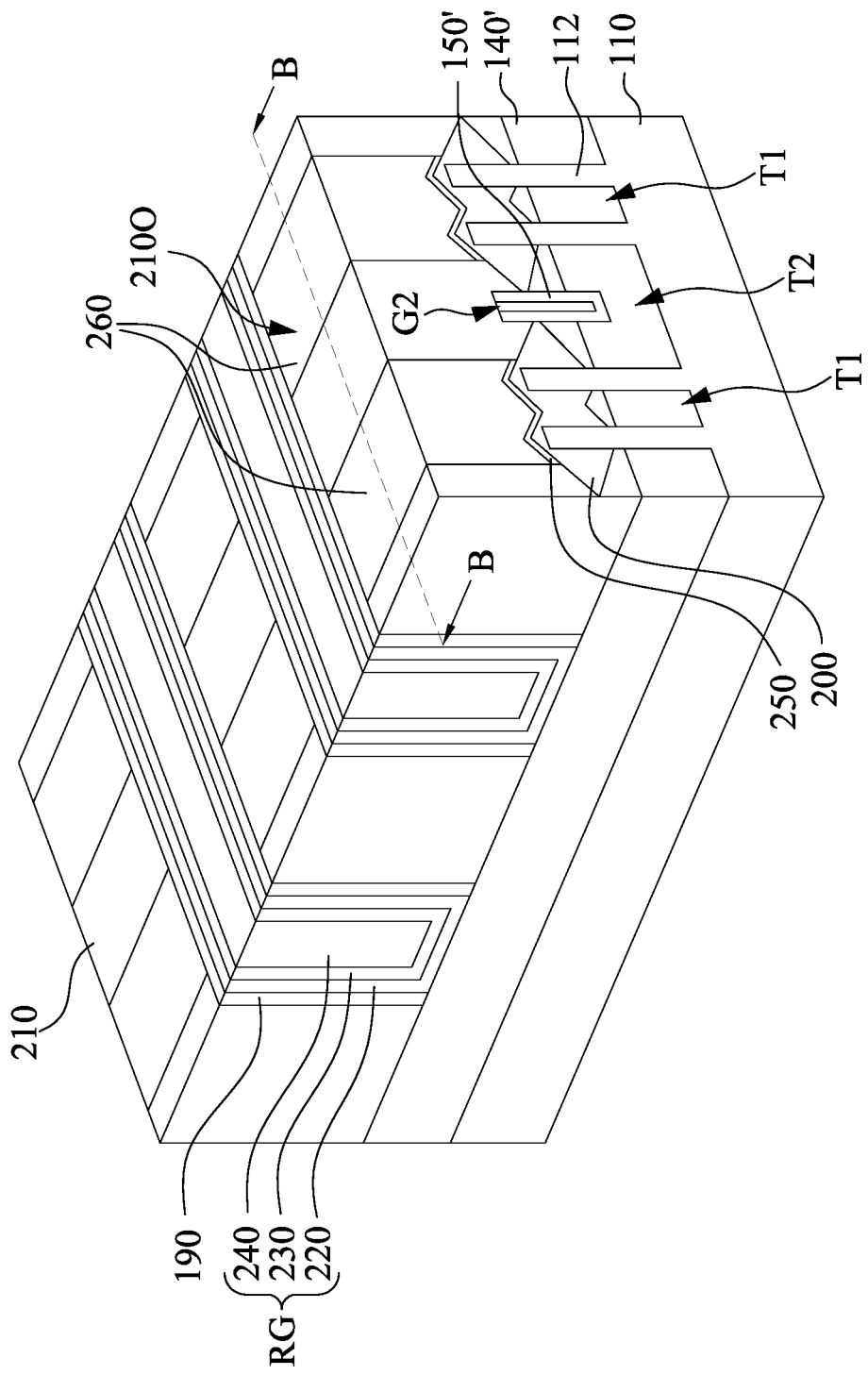
Figure 16B:
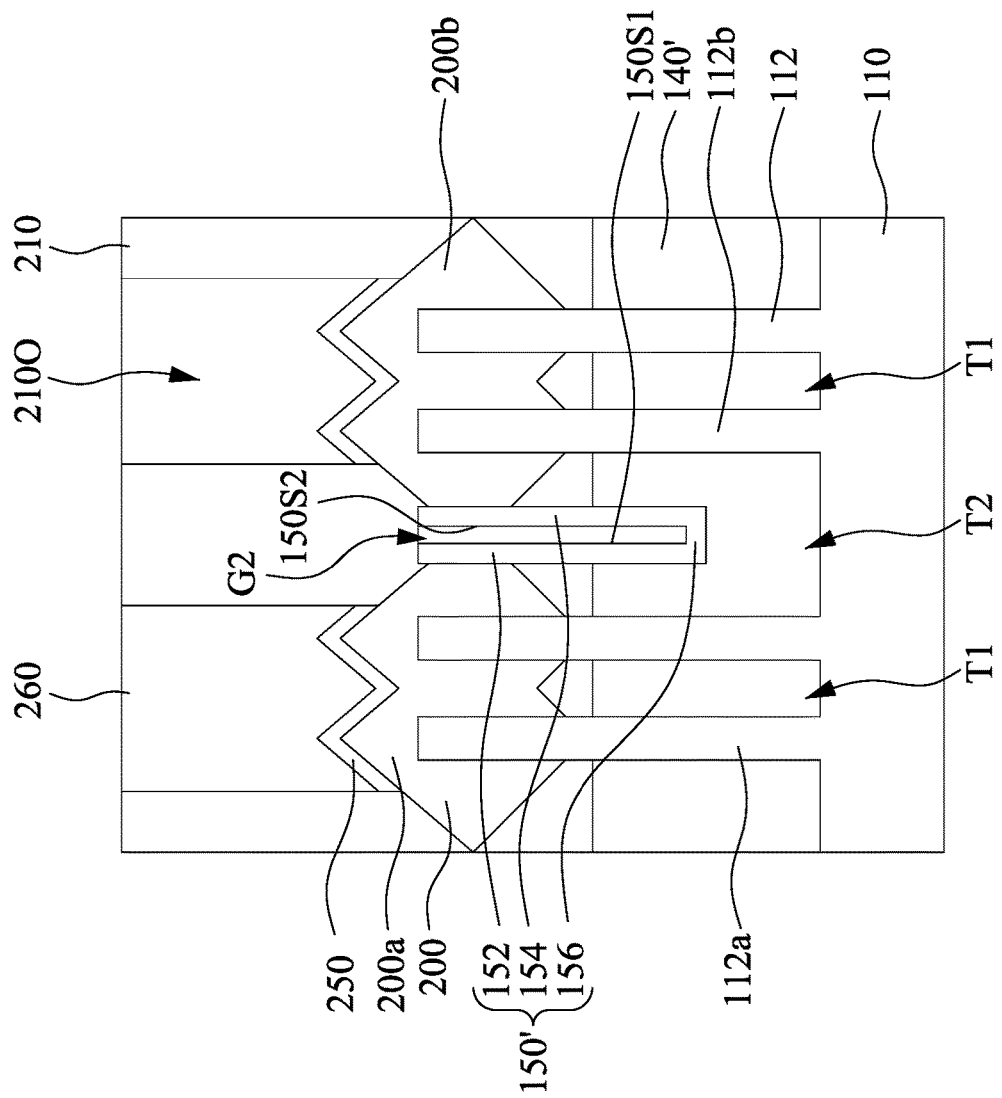

Reference is made to FIG. 1 and FIGS. 15, 16A and 16B. FIG. 16B is a cross-sectional view taken along line B-B in FIG. 16A. The method 100 proceeds to step S13, where source/drain contacts 260 are formed in the ILD layer 210. In some embodiments, referring to FIG. 15, contact openings 210O are formed through the ILD layer 210 to expose the epitaxial source/drain structures 200 by using suitable photolithography and etching techniques. Subsequently, referring to FIGS. 16A and 16B, silicide layers 250 are formed on the exposed surface of the epitaxial source/drain structures 200 by using a silicidation process, followed by forming the source/drain contacts 260 over the epitaxial source/drain structures 200. Silicidation process may be performed by depositing a metal layer (e.g., nickel layer or cobalt layer) over the exposed surface of the epitaxial source/drain structures 200, annealing the metal layer such that the metal layer reacts with silicon (and germanium if present) in the epitaxial source/drain structures 200 to form the silicide layers 250 (e.g., nickel silicide or cobalt silicide), and thereafter removing the non-reacted metal layer. Source/drain contacts 260 may be formed by depositing one or more metal materials (e.g., tungsten, cobalt, copper, the like or combinations thereof) to fill the contact holes by using suitable deposition techniques (e.g., CVD, PVD, ALD, the like or combinations thereof), followed by a CMP process to remove excess metal materials external to the contact opening 210O. In the present embodiments, the source/drain contacts 260 are respectively formed over the epitaxial source/drain structures 200a and 200b, and isolated from each other.

In some embodiments of the present disclosure, the isolation dielectric plug 150' extends between the source/drain epitaxial structures 200a and 200b along a first direction parallel to longitudinal axes of the semiconductor fins 112, and the isolation dielectric plug 150' has a U-shape profile when viewed in a cross section taken along a direction parallel to a longitudinal axis of the gate structure RG. In the present embodiments, the isolation dielectric plug 150' includes a first portion 152 adjacent to the epitaxial source/drain structure 200a and a second portion 154 adjacent to the epitaxial source/drain structure 200b. In some embodiments, the first portion 152 and the second portion 154 of the isolation dielectric plug 150' are respectively have inner sidewalls 150S1 and 150S2 facing each other. The air gap G2 is between the inner sidewalls 150S1 and 150S2 of the first and the second portions 152 and 154 of the isolation dielectric plug 150'. In some embodiments, the isolation dielectric plug 150' further includes a third portion 156 connecting a bottom end of the first portion 152 to a bottom end of the second portion 154.

Figure 17:
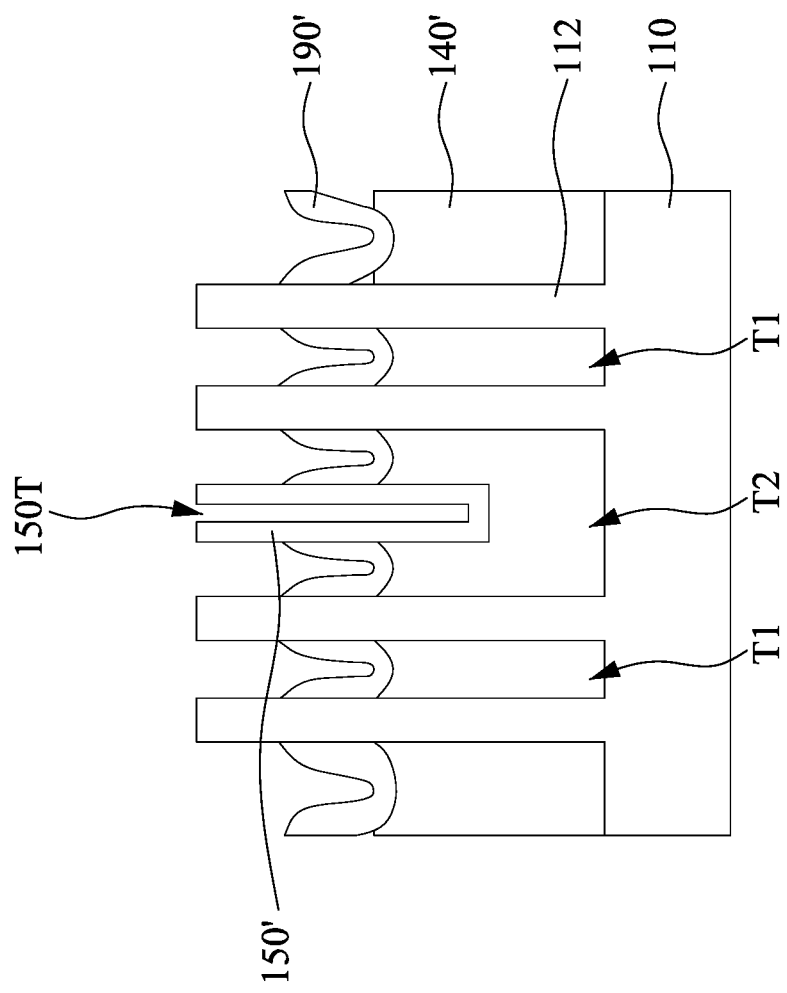
FIGS. 17-18 illustrate a method for manufacturing a semiconductor device at various stages in accordance with some embodiments of the present disclosure.
Figure 18:
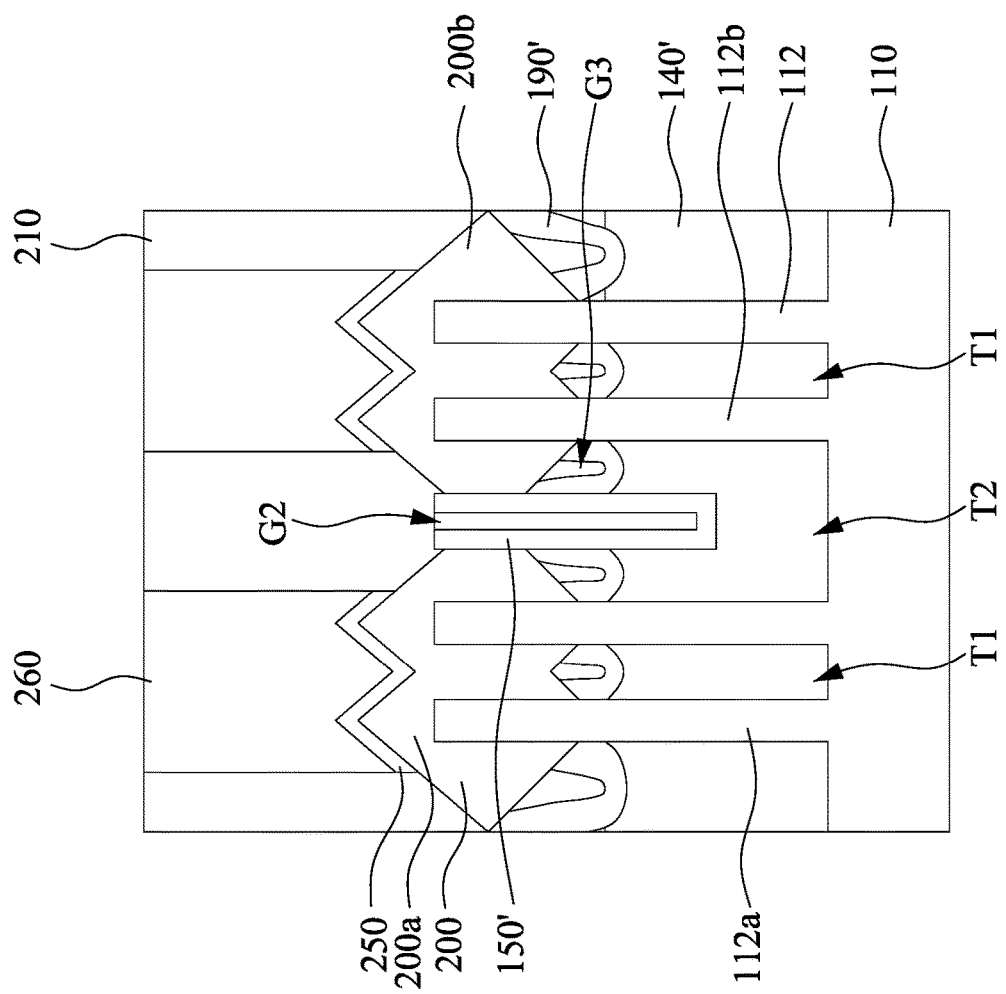

FIGS. 17-18 illustrate a method for manufacturing a semiconductor device at various stages in accordance with some embodiments of the present disclosure. FIG. 17 is a cross sectional view taken along the same line as FIG. 11B. Referring to FIG. 17, in some embodiments, along with the formation of the gate spacers 190 (referring to FIGS. 11A and 11B), fin sidewall spacers 190' may be formed on opposite sidewalls of the semiconductor fins 112. The method of forming the gate spacers 190 and fin sidewall spacers 190' includes blanket forming a dielectric layer on the structure shown in FIG. 10 using, for example, CVD, PVD or ALD, and then performing an etching process such as anisotropic etching to remove horizontal portions of the dielectric layer. In some embodiments, the etching process may be performed such that the dielectric layer may have remaining portions on sidewalls of the gate structures DG and sidewalls of the semiconductor fins 112. The remaining portions of the dielectric layer on sidewalls of the gate structures DG can serve as the gate spacers 190, and the remaining portions of the dielectric layer on sidewalls of the semiconductor fins 112 may be referred to as the fin sidewall spacers 190'. The fin sidewall spacers 190' may also be located on sidewalls of the isolation dielectric plug 150'. The fin sidewall spacers 190' may extend along sidewalls of the semiconductor fin 112, sidewalls of the isolation dielectric plug 150', and the top surface of the STI structure 140', and thus has a trench therein. In some embodiments, the gate spacers 190 and the fin sidewall spacers 190' may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 190 and the fin sidewall spacers 190' may include a single layer or multilayer structure made of different dielectric materials.

Referring to FIG. 18, the epitaxial source/drain structures 200 are respectively formed over portions of the semiconductor fins 112 not covered by the gate structures DG. In some embodiments, the epitaxial source/drain structures 200 may cover the top ends of the fin sidewall spacers 190' and the trench therein, and thus air gaps G3 are formed between the fin sidewall spacers 190' and the epitaxial source/drain structures 200. Other details of the present embodiments are similar to those illustrated in embodiments of FIGS. 2-16B, and will not be repeated herein.

Figure 19:
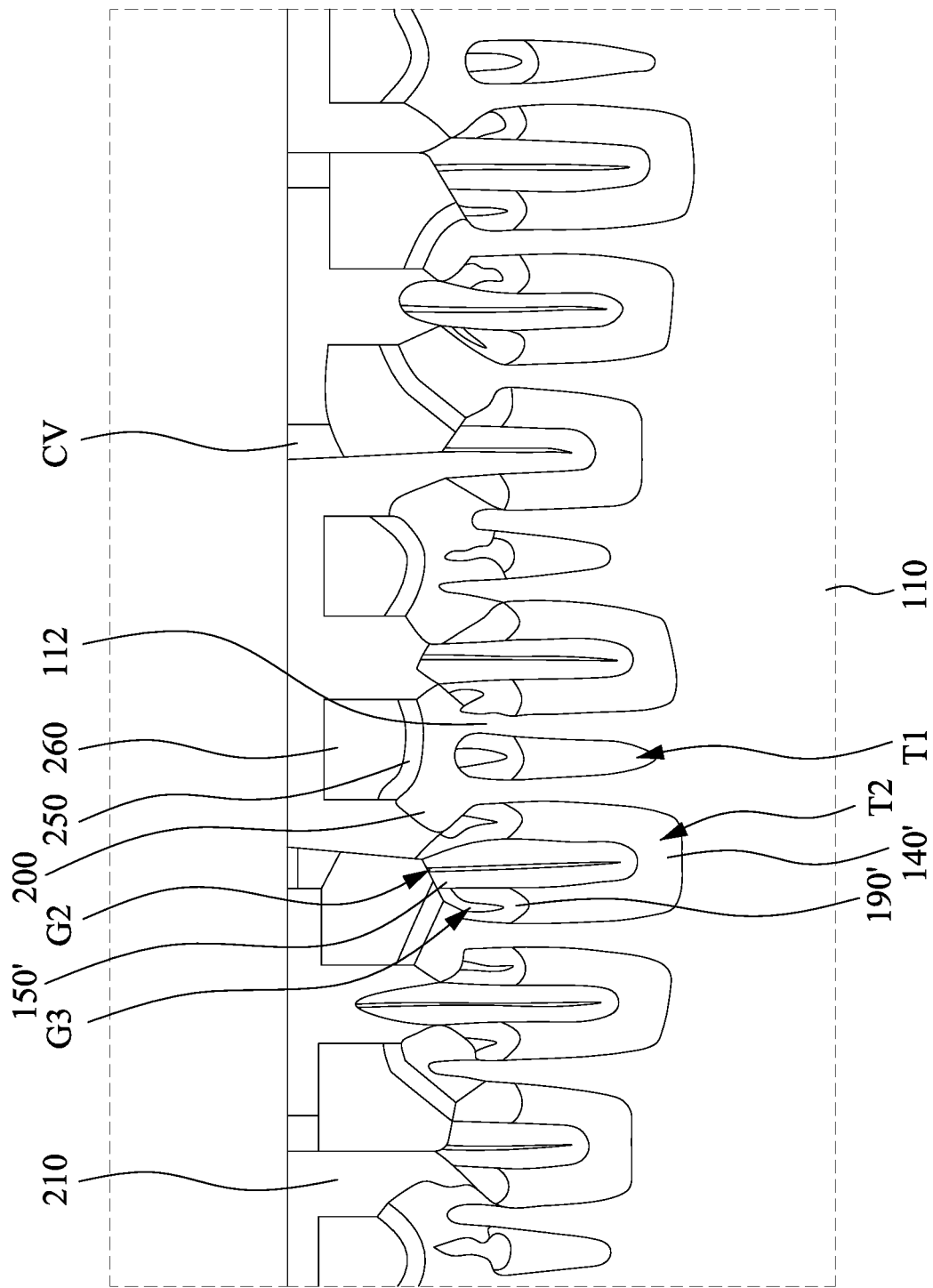
FIG. 19 depicts a cross-sectional view of a semiconductor device in accordance with some embodiments of the present disclosure.

FIG. 19 depicts a cross-sectional view of a semiconductor device in accordance with some embodiments of the present disclosure. As the embodiments illustrated in FIG. 18, the isolation dielectric plug 150' is located in the wide trench T2 and spacing the epitaxial source/drain structures 200 on the semiconductor fins 112 on opposite sides of the trench T2 from each other. In some embodiments, the isolation dielectric plug 150' may have the gaps G2 therein. In some embodiments, fin sidewall spacers 190' may be located on opposite sides of the semiconductor fins 112, and may have an air gaps G3 therein. In some embodiments, air gaps G2 in the 150' may extend to a position lower than a bottom end of the fin sidewall spacers 190'. In some embodiments, contact vias CV are formed over the contacts 260 to establish conductive path to an interconnect structure formed thereon. The contact vias CV may be formed by etching a via opening to expose the contacts, and depositing one or more metal materials (e.g., tungsten, cobalt, copper, the like or combinations thereof) to fill the via holes by using suitable deposition techniques (e.g., CVD, PVD, ALD, the like or combinations thereof), followed by a CMP process to remove excess metal materials external to the via opening. Other details of the present embodiments are similar to the previously described embodiments, and will not be repeated herein.

Figure 20:
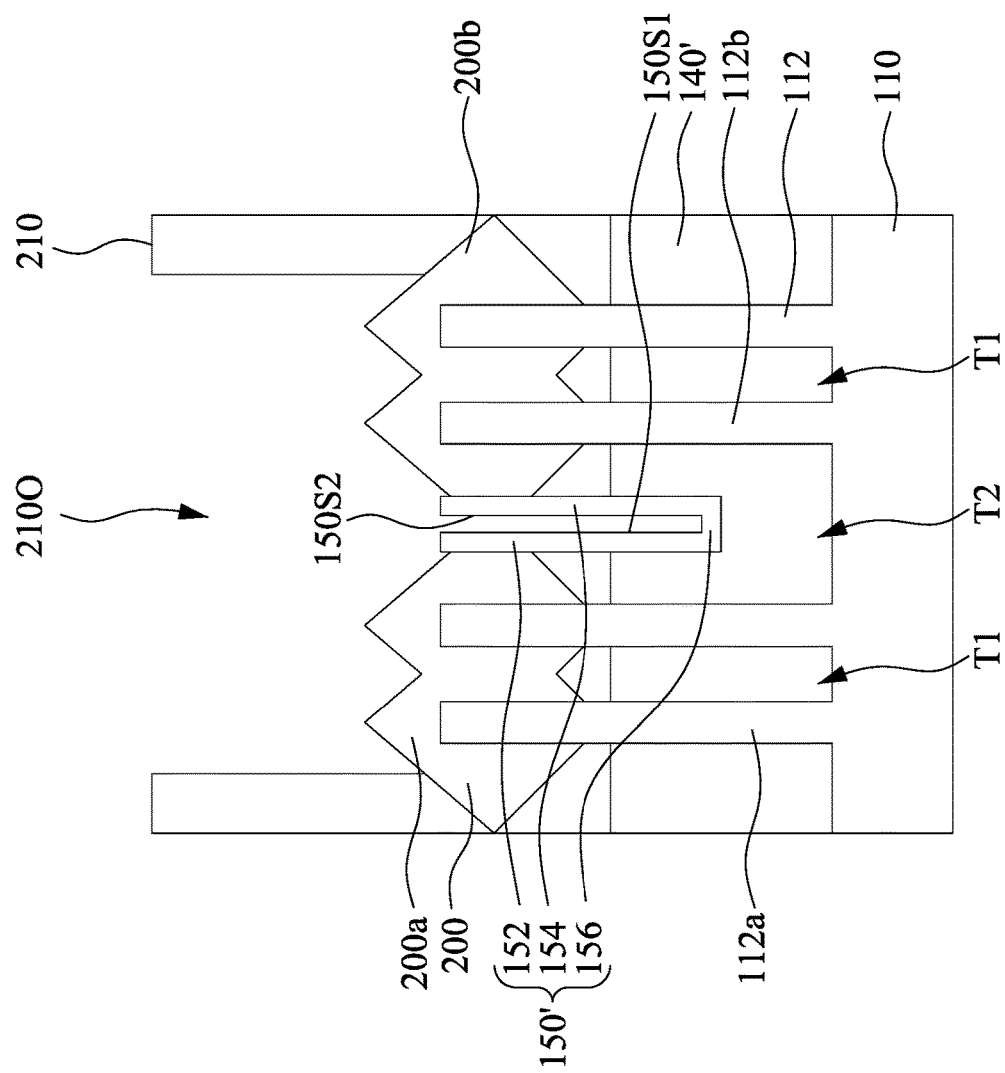
FIGS. 20-21B illustrate a method for manufacturing a semiconductor device at various stages in accordance with some embodiments of the present disclosure.
Figure 21A:
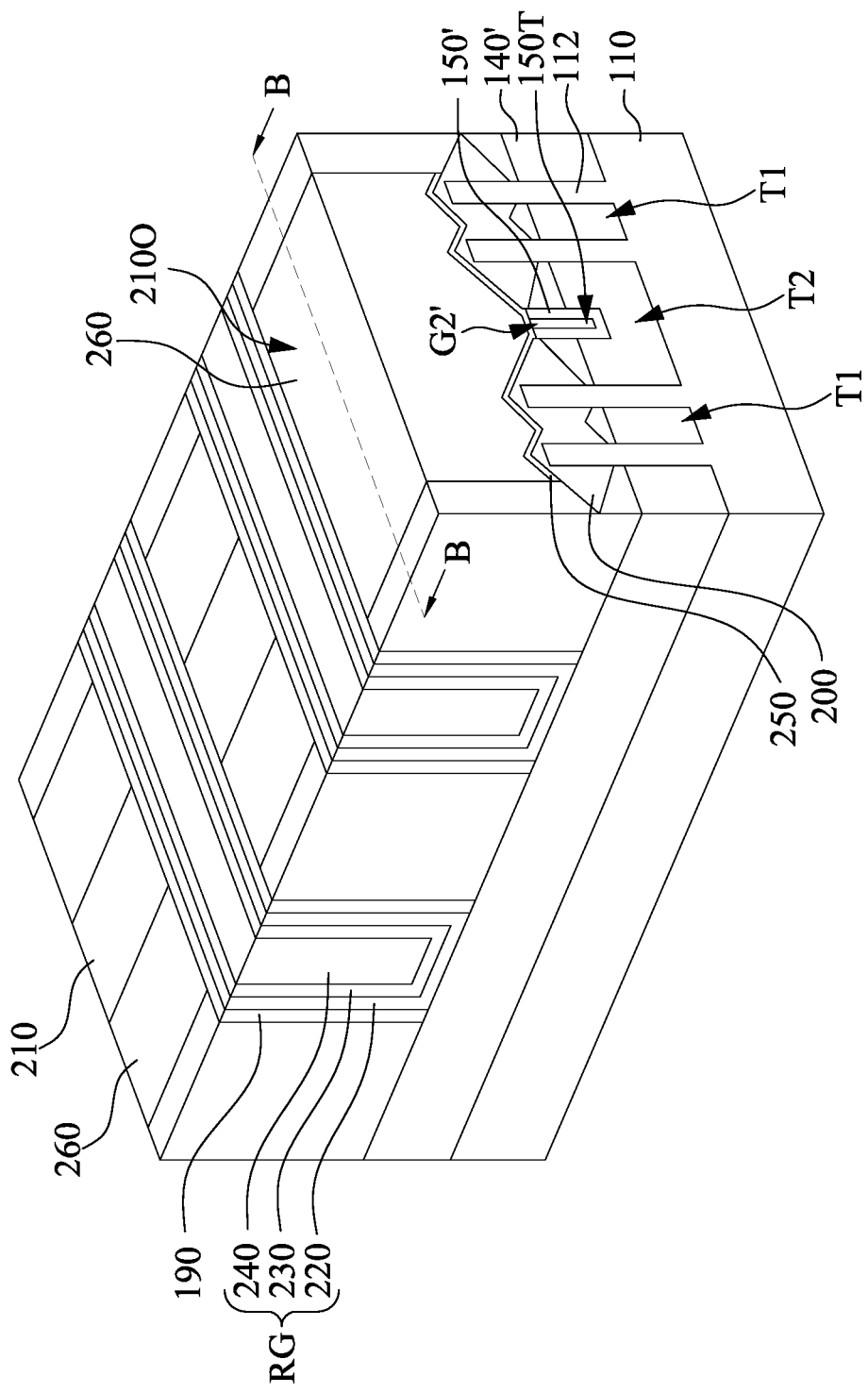
Figure 21B:
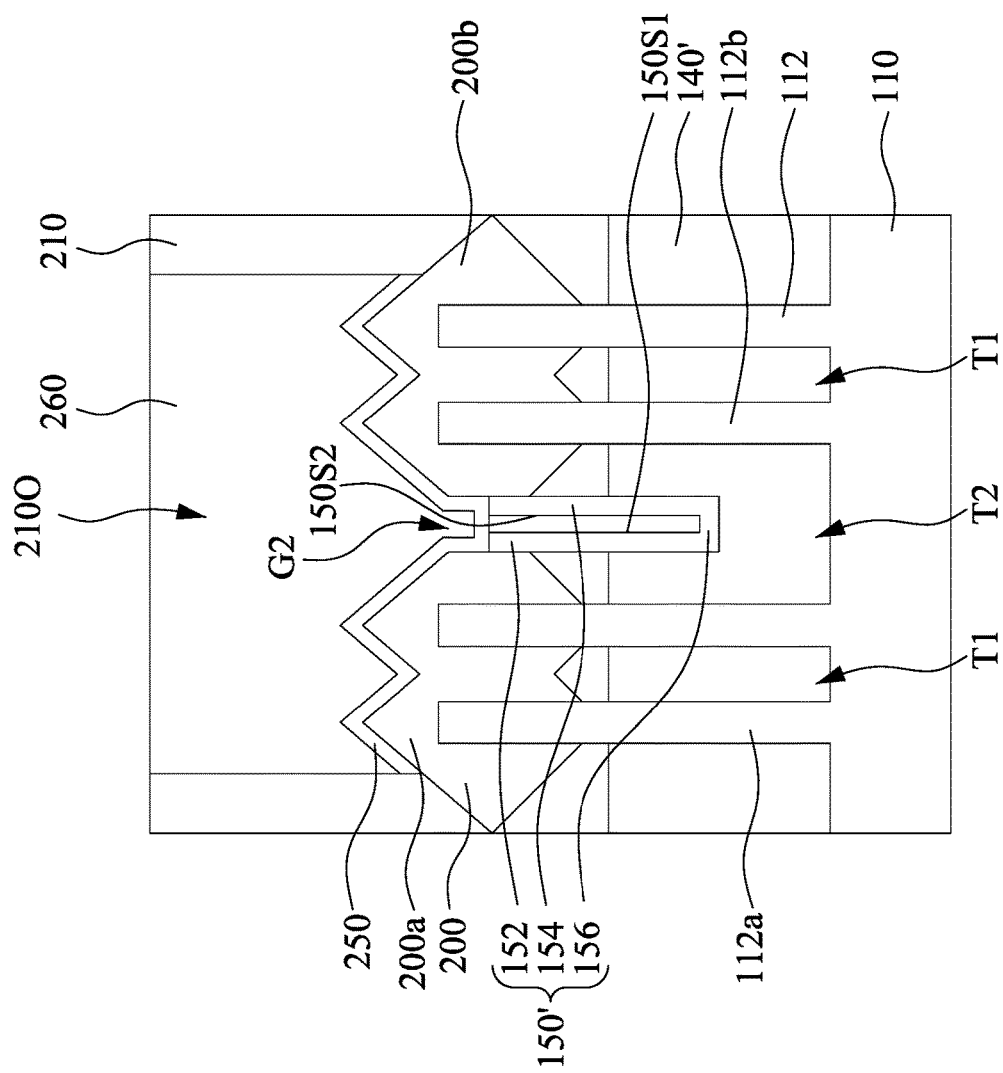

FIGS. 20-21B is a schematic view of a semiconductor device in accordance with some embodiments of the present disclosure. The semiconductor device of the present embodiments is similar to those in the embodiments of FIGS. 2-16B, except that some of the source/drain contact 260 may extend across the isolation dielectric plug 150'. In the present embodiments, for the need of some integrated circuit designs, for example, having the epitaxial source/drain structures 200a and 200b at the voltages, the source/drain contact 260 may extend across the isolation dielectric plug 150' and connect the epitaxial source/drain structure 200a to the epitaxial source/drain structure 200b.

Referring to FIG. 20, in the present embodiments, the contact opening 210O is etched to expose the epitaxial source/drain structures 200a and 200b. The formation of the contact opening 210O may leave top ends of the isolation dielectric plug 150' exposed by the contact opening 210O. In some further embodiments, the trench 150T of the isolation dielectric plug 150' may be exposed by the contact opening 210O.

Reference is then made to FIGS. 21A and 21B. FIG. 21B is a cross-sectional view taken along line B-B in FIG. 21A. The silicide layers 250 and the source/drain contact 260 may be formed in the contact opening 210O to establish electrical connection with the epitaxial source/drain structures 200a and 200b. The silicide layers 250 may cover respective source/drain structures 200a and 200b. In some embodiments, the silicide layers 250 over the respective source/drain structures 200a and 200b may be connected to each other. In some embodiments, the silicide layers 250 may be a silicide layer covering source/drain structures 200a and 200b, the top ends of the isolation dielectric plug 150', and the trench 150T therein. Thus, after the formation of the source/drain contact 260 and the silicide layer 250, a gap G2' may be retained between the isolation dielectric plug 150' and the silicide layer 250 or between isolation dielectric plug 150' and the source/drain contact 260. For example, a combination of the silicide layer 250 and the source/drain contact 260 may seal the gap G2' in the isolation dielectric plug 150'. In some embodiments, the gap G2' is an air gap void of any solid material. In some alternative embodiments, the gap G2' may be partially or entirely filled with some dielectric material that is deposited during aforementioned one or more processes. The air or dielectric materials in the gap G2' may have a lower dielectric constant than that of the materials of the isolation dielectric plug 150' (e.g., high-k dielectric materials), and thus the configuration of the gap G2' in the isolation dielectric plug 150' is beneficial for achieving low capacitance. In other words, the isolation dielectric plug 150' may have a gap with portions (e.g., the gaps G1') below the gate dielectric layer 220, portions below the gate spacers 190 (referring to FIGS. 11A and 11B), and portions below the source/drain contact 260 and the source/drain contract 260 (e.g., the gaps G2').

In some embodiments, one or more etching processes performed after the formation of the isolation dielectric plug 150' may consume the isolation dielectric plug 150'. For example, etching the contact opening 210O for accommodating the source/drain contact 260 may consume the isolation dielectric plug 150'. Through the etching processes, the top surface of the isolation dielectric plug 150' may be lowered to a position below a top end of the semiconductor fins 112. In some embodiments, referring to FIG. 20, the top surface of the isolation dielectric plug 150' may be lowered to a position below a widest portion of the epitaxial source/drain structures 200. As a result, the source/drain contact 260 and the silicide layer 250 formed in the contact opening 210O later may have a portion lower than the widest portion of the epitaxial source/drain structures. For example, a bottom surface of the silicide layer 250 formed in the contact opening 210O later may be lower than the widest portion of the epitaxial source/drain structures 200. In some other embodiments, the top surface of the isolation dielectric plug 150' may be higher than a position of a widest portion of the epitaxial source/drain structures and lower than the top ends of the semiconductor fins 112. In some other embodiments, the etching processes (e.g., etching the contact opening 210O) may not substantially consume isolation dielectric plug 150', such that the top surface of the isolation dielectric plug 150' may be substantially level with the top ends of the semiconductor fins 112. Other details of the present embodiments are similar to those illustrated in FIGS. 2-16B, and will not be repeated herein.

Figure 22:
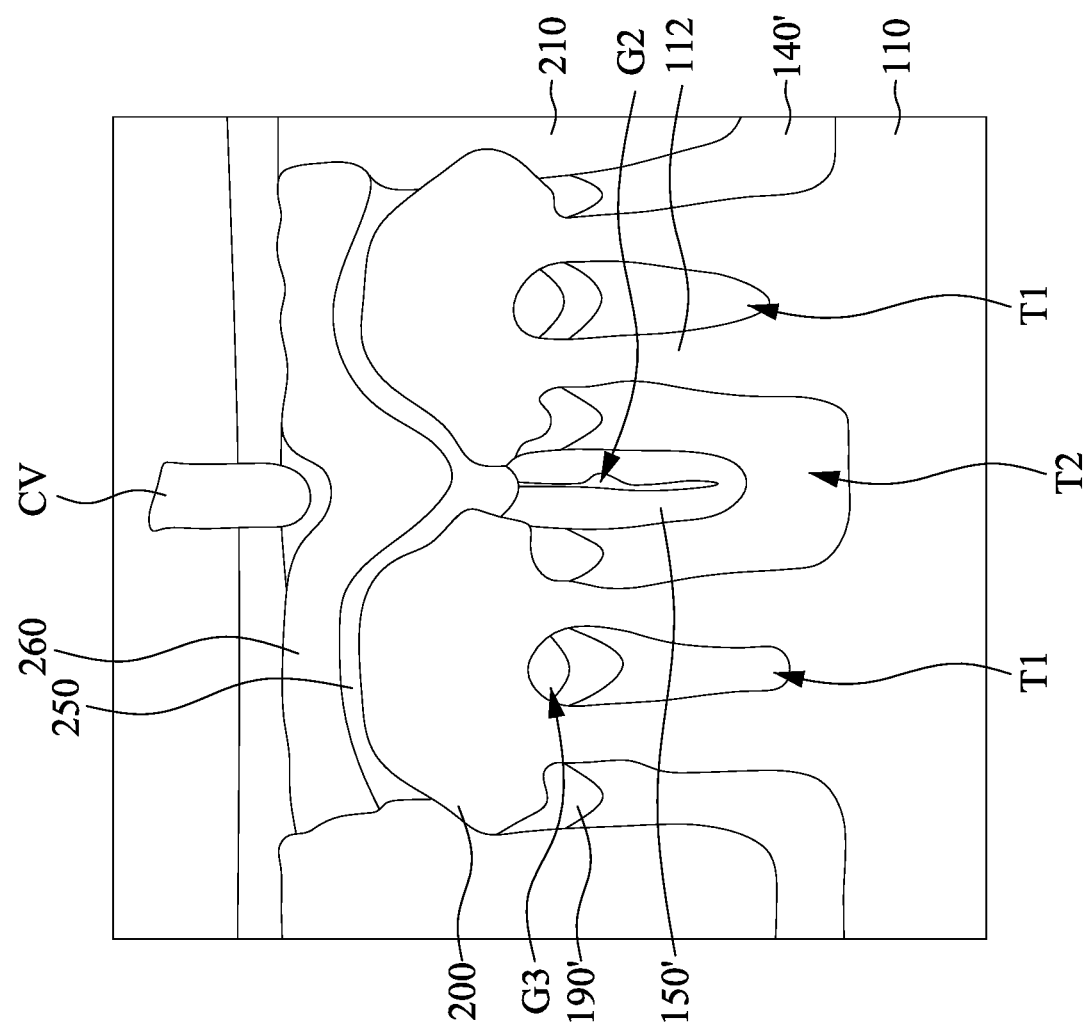
FIG. 22 depicts a cross-sectional view of a semiconductor device in accordance with some embodiments of the present disclosure.

FIG. 22 depicts a cross-sectional view of a semiconductor device in accordance with some embodiments of the present disclosure. As the embodiments illustrated in FIGS. 21A and 21B, the isolation dielectric plug 150' is located in the wide trench T2 and spacing the epitaxial source/drain structures 200 on the fins 112 on opposite sides of the trench T2 apart from each other. In some embodiments, the isolation dielectric plug 150' may have the air gaps G2 therein. In some embodiments, a top of the isolation dielectric plug 150' (or a bottom surface of the silicide layer 250) may be lower than the widest portion of the epitaxial source/drain structures 200. In some embodiments, fin sidewall spacers 190' may be located on sides of the fins 112, and may have gaps G3 therein. Other details of the present embodiments are similar to the previously described embodiments, and will not be repeated herein.

FIGS. 23-27 illustrate a method for manufacturing a semiconductor device at various stages in accordance with some embodiments of the present disclosure. The present embodiments are similar to those of the embodiments of FIGS. 2-16B, except that the formed isolation dielectric plug 150' in FIG. 27 may have an asymmetric profile.

Figure 23:
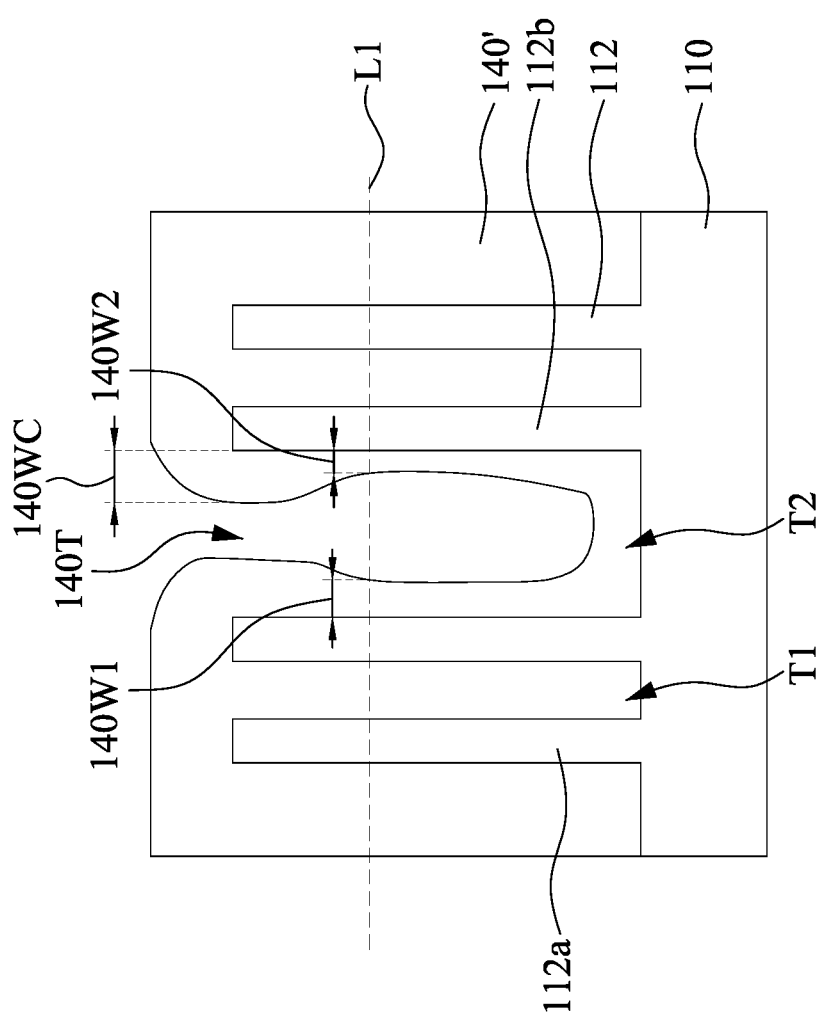
FIGS. 23-27 illustrate a method for manufacturing a semiconductor device at various stages in accordance with some embodiments of the present disclosure.

Referring to FIG. 23, the first isolation dielectric layer 140 is deposited to cover the fins 112a and 112b with a trench 140T between the fins 112a and 112b. The deposition of the first isolation dielectric layer 140 may be an ALD process. In some embodiments, because of overhang profiles resulting from deposition, the deposition process may leave different amounts of the dielectric material on a bottom of the trench T2, a sidewall of the fin 112a, a sidewall of the fin 112b, and top corners of the fins 112a and 112b. In the present embodiments, at the same height, an amount of the dielectric material on the sidewall of the fin 112a may be different from an amount of the dielectric material on the sidewall of the fin 112b. For example, the first isolation dielectric layer 140 has a thickness 140W1 on the sidewall of the fin 112a and a thickness 140W2 on the sidewall of the fin 112b at the same height level, and the thickness 140W2 is different from the thickness 140W1. As illustrated in the figure, at the same height level as indicated by the dotted line L1, the thickness 140W2 is less than the thickness 140W1. At other height levels, the thickness 140W2 may be the same or greater than the thickness 140W1. Therefore, the trench 140T may have an asymmetric profile.

In some embodiments, an amount of the dielectric material on the top corners of the fins 112a and 112b are greater than an amount of the dielectric material on the sidewalls of the fins 112a and 112b. For example, as illustrated in the figure, the first isolation dielectric layer 140 has a thickness 140WC on the top corners of the fins 112a and 112b, and the thickness 140WC is greater than the thickness 140W1/140W2. Furthermore, in the present embodiments, an amount of the dielectric material near the lower portions of the sidewalls of the fins 112a and 112b is greater than an amount of the dielectric material on the middle portions of the sidewalls of the fins 112a and 112b. Thus, the trench 140T may have a largest width at its middle.

Figure 24:
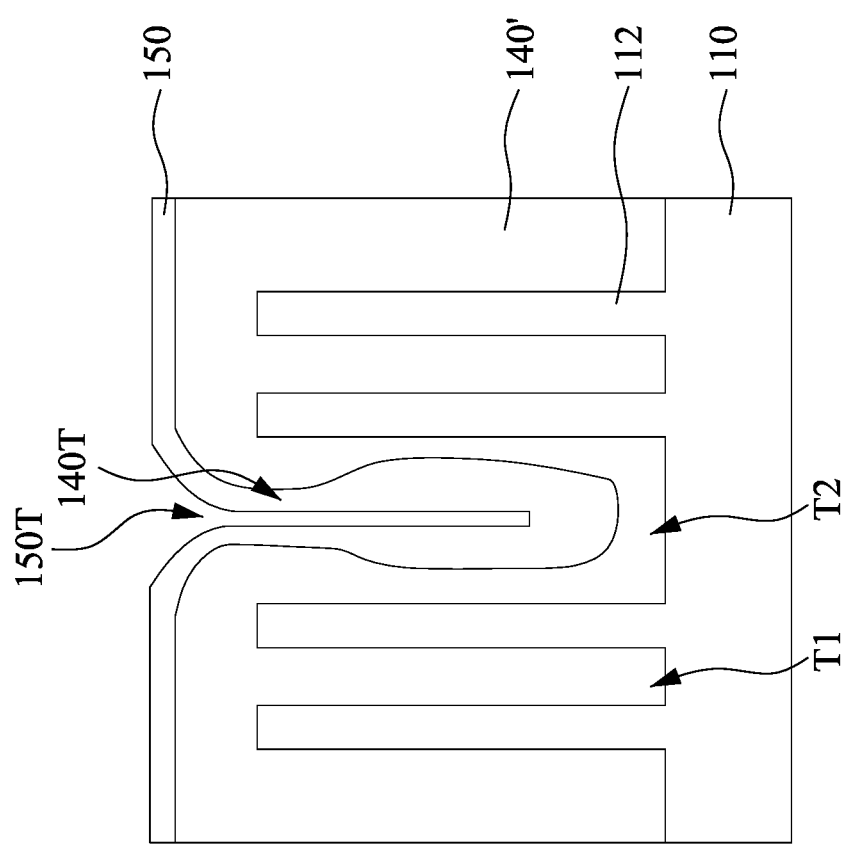

Referring to FIG. 24, the second isolation dielectric layer 150 is deposited to into the trench 140T, and thus have an asymmetric profile corresponding to the trench 140T of the first isolation dielectric layer 140. The deposition of the second isolation dielectric layer 150 may be an ALD process.

Figure 25:
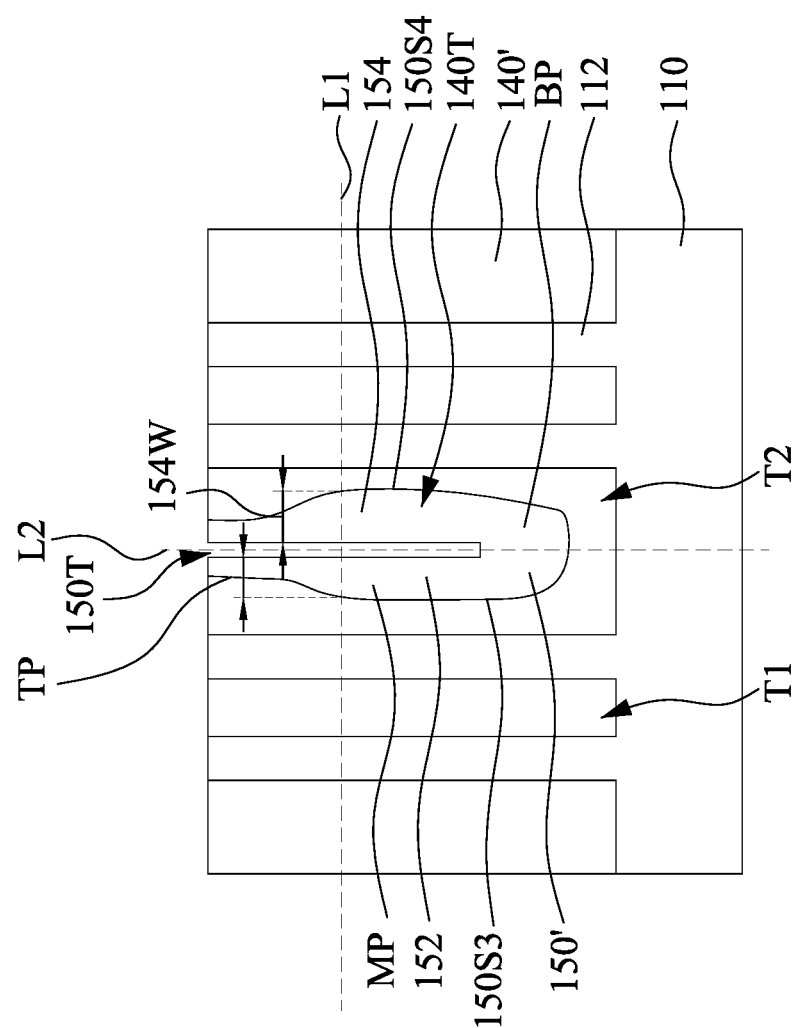

Subsequently, referring to FIG. 25, a planarization process is performed to remove excess portions of the first and second isolation dielectric layers 140 and 150 (referring to FIG. 24) higher than top ends of the semiconductor fins 112 (e.g., external to the trenches T1 and T2). After the planarization process, a remaining portion of first isolation dielectric layer 140 (referring to FIG. 24) may be referred to as a shallow trench isolation (STI) structure 140', and a remaining portion of the second isolation dielectric layer 150 (referring to FIG. 24) may be referred to as isolation dielectric plug 150'.

In some embodiments, because of the asymmetric profile of the trench 140T, the formed isolation dielectric plug 150' may have a corresponding asymmetric profile. For example, a sidewall 150S3 of the isolation dielectric plug 150' facing the fins 112a is asymmetric with a sidewall 150S4 of the isolation dielectric plug 150' facing the fins 112b about a central axis of the isolation dielectric plug 150' normal to the substrate 110. In some embodiments, as aforementioned, the isolation dielectric plug 150' has the trench 150T therein. For example, the sidewall 150S3 is asymmetric with the sidewall 150S4 about a central axis of the trench 150T normal to the substrate 110 (indicated as dashed line L2). In some embodiments, the isolation dielectric plug 150' may have a portion 152 between the trench 150T and the fin 112a and a portion 154 between the trench 150T and the fin 112b, and at the same height level, a thickness 152W of the portion 152 may be different from a thickness 154W of the portion 154. For example, as illustrated in the figure, at the same height level as indicated by the dotted line L1, the thickness 154W is greater than thickness 152W. At other height levels, the thickness 154W may be the same or less than the thickness 154W.

In the present embodiments, since the trench 140T has a largest width at its middle, a middle portion MP of the isolation dielectric plug 150' is wider than a top portion TP of the isolation dielectric plug 150' higher than the middle portion MP thereof and wider than a bottom portion BP of the isolation dielectric plug 150' lower than the middle portion MP thereof.

Figure 26:
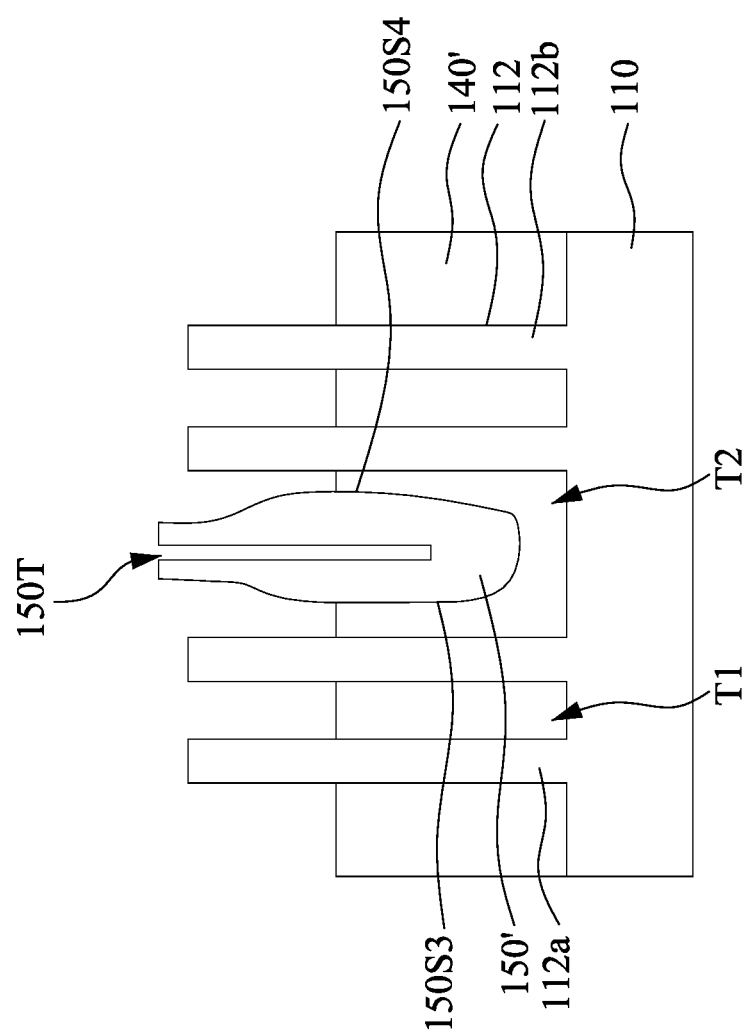

Referring to FIG. 26, the STI structure 140' is recessed through an etching back process, such that the semiconductor fins 112 and the isolation dielectric plug 150' protrude from the top surface of the STI structure 140'.

Figure 27:
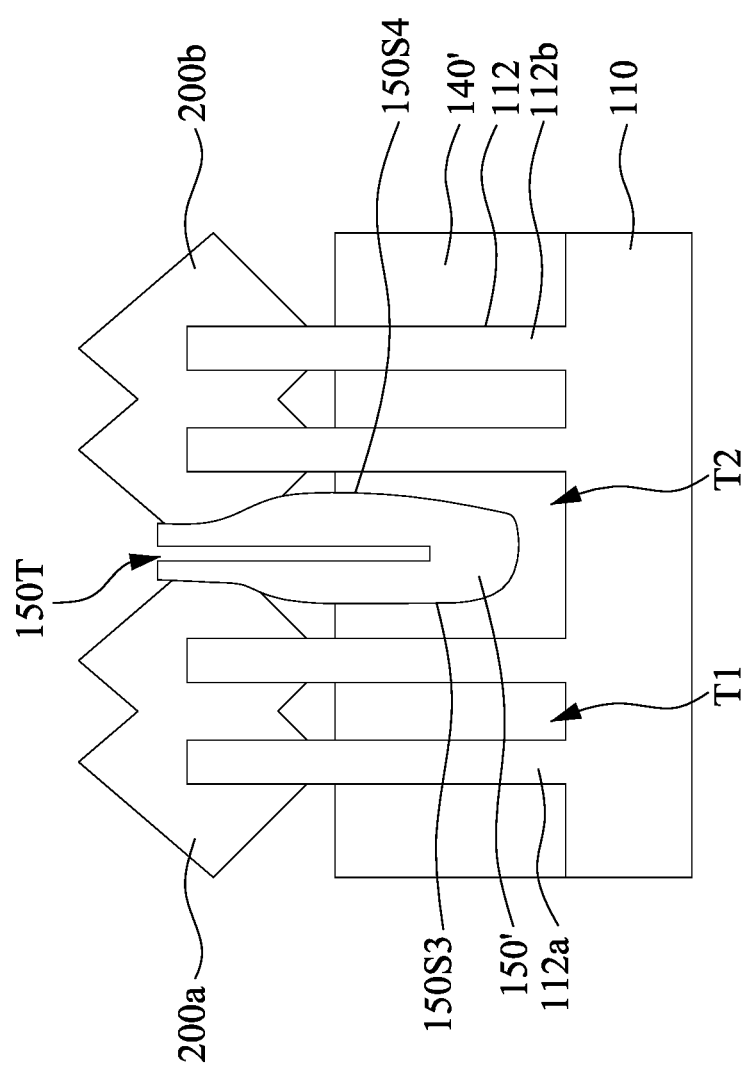

Referring to FIG. 27, epitaxial source/drain structures 200a and 200b are respectively formed over the semiconductor fins 112a and 112b and separated by the isolation dielectric plug 150'. In some embodiments, the epitaxial growth of the source/drain structures 200 may exert force on the top portions of the isolation dielectric plug 150', such that the top portions of the isolation dielectric plug 150' are pushed toward each other, which may also result in the narrow top portion of the isolation dielectric plug 150'. For example, a width of a top portion of the isolation dielectric plug 150' between the epitaxial source/drain structures 200 is less than a width of a middle portion of the isolation dielectric plug 150' below the top portion of the isolation dielectric plug 150'. Other details of the present embodiments are similar to those illustrated in FIGS. 2-16B, and will not be repeated herein.

FIGS. 28-32 illustrate a method for manufacturing a semiconductor device at various stages in accordance with some embodiments of the present disclosure. The present embodiments are similar to those of the embodiments of FIGS. 2-16B, except that the formed isolation dielectric plug 150' in FIG. 32 may have another asymmetric profile.

Figure 28:
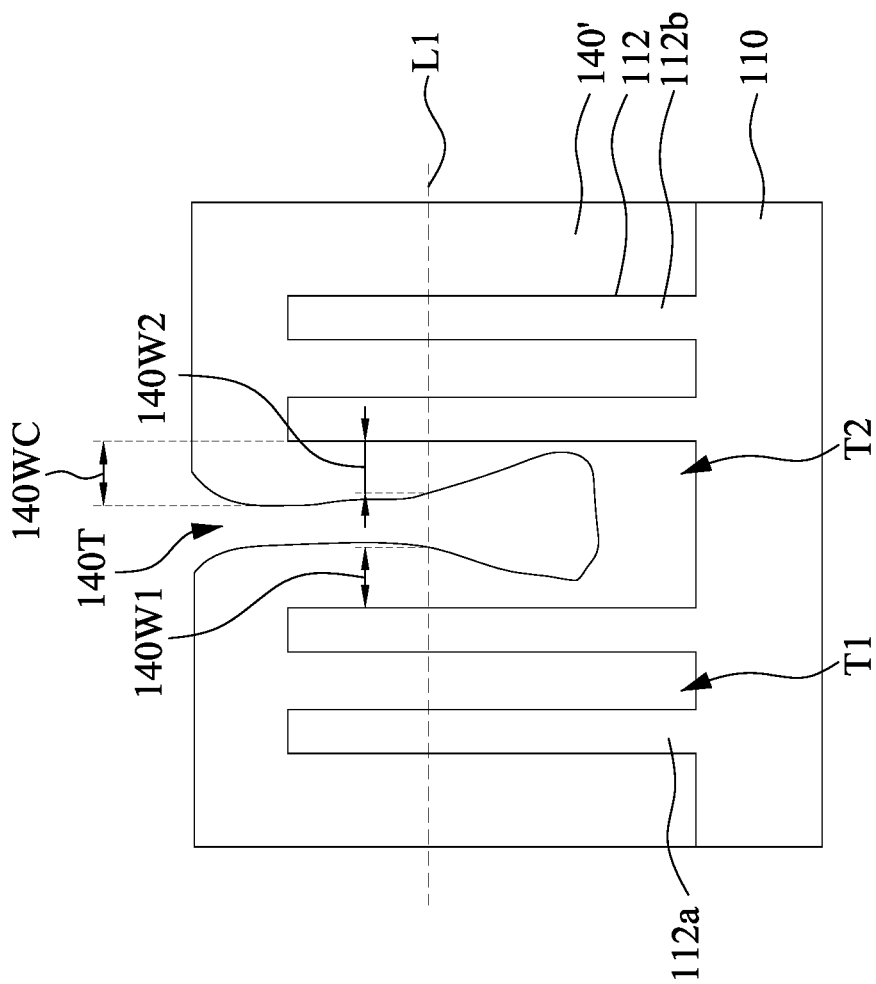
FIGS. 28-32 illustrate a method for manufacturing a semiconductor device at various stages in accordance with some embodiments of the present disclosure.

Referring to FIG. 28, the first isolation dielectric layer 140 is deposited to cover the fins 112a and 112b with a trench 140T between the fins 112a and 112b. The deposition of the first isolation dielectric layer 140 may be an ALD process. As aforementioned, in some embodiments, because of overhang profiles resulting from deposition, the deposition process may deposit different amounts of the dielectric material on a bottom of the trench T2, a sidewall of the fin 112a, a sidewall of the fin 112b, and top corners of the fins 112a and 112b. For example, the first isolation dielectric layer 140 has a thickness 140W1 on the sidewall of the fin 112a and a thickness 140W2 on the sidewall of the fin 112b at the same height level, and the thickness 140W2 is different from the thickness 140W1. As illustrated in the figure, at the same height level as indicated by the dotted line L1, the thickness 140W2 is less than the thickness 140W1. At other height levels, the thickness 140W2 may be the same or greater than the thickness 140W1. Therefore, the trench 140T may have an asymmetric profile.

In some embodiments, an amount of the dielectric material on the top corners of the fins 112a and 112b are greater than an amount of the dielectric material on the sidewalls of the fins 112a and 112b, because of the overhang profile resulting from deposition. For example, as illustrated in the figure, the first isolation dielectric layer 140 has a thickness 140WC on the top corners of the fins 112a and 112b, and the thickness 140WC is less than the thickness 140W1/140W2. Furthermore, in the present embodiments, an amount of the dielectric material near the lower portions of the sidewalls of the fins 112a and 112b is less than an amount of the dielectric material near the middle portions of the sidewalls of the fins 112a and 112b. Thus, the trench 140T may have a largest width at its bottom.

Figure 29:
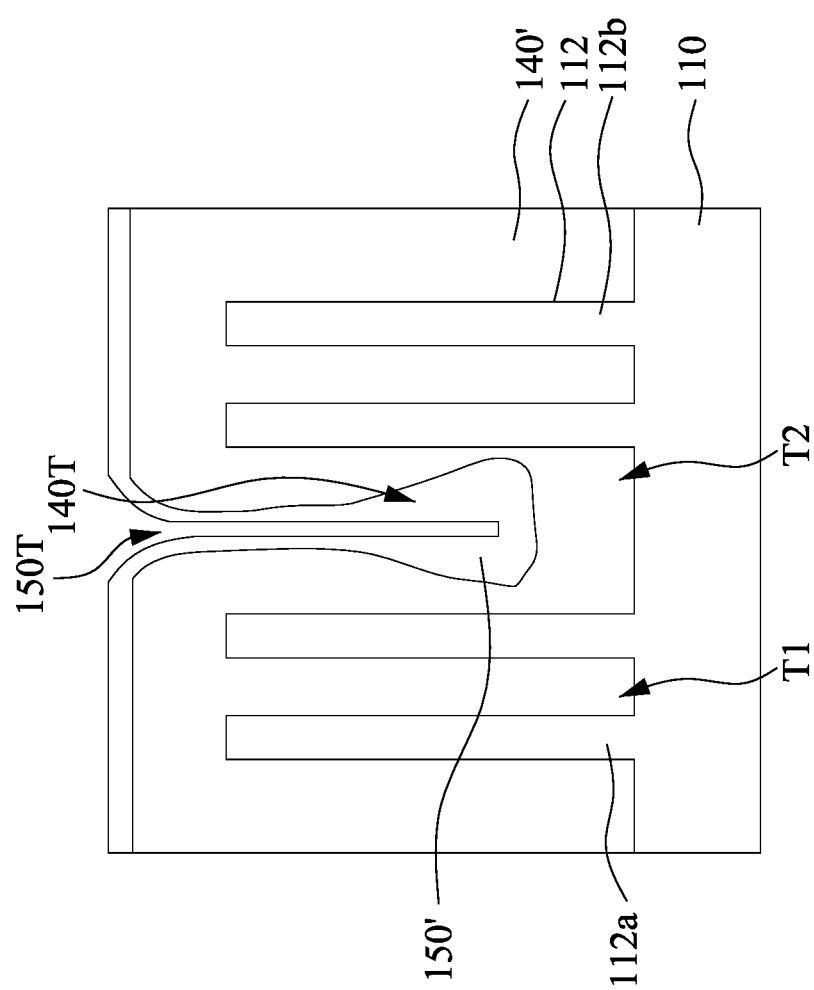

Referring to FIG. 29, the second isolation dielectric layer 150 is deposited into the trench 140T, and thus have an asymmetric profile corresponding to the trench 140T of the first isolation dielectric layer 140. The deposition of the second isolation dielectric layer 150 may be an ALD process.

Figure 30:
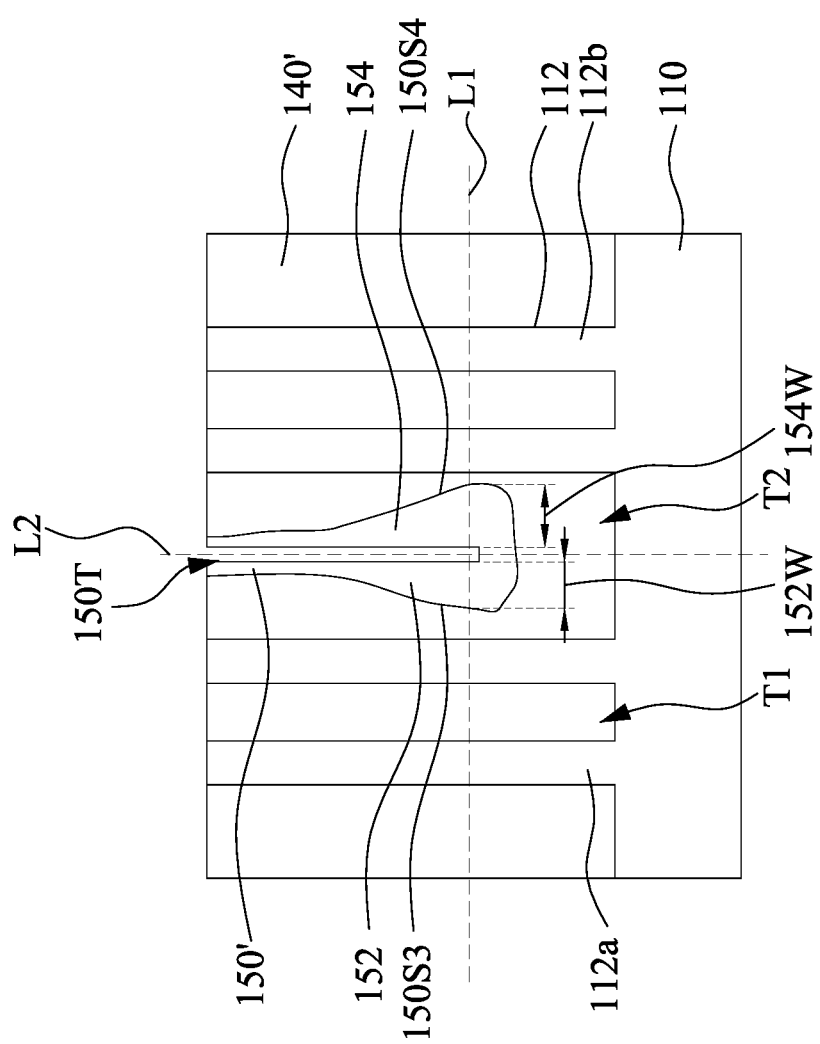

Subsequently, referring to FIG. 30, a planarization process is performed to remove excess portions of the first and second isolation dielectric layers 140 and 150 (referring to FIG. 24) higher than top ends of the semiconductor fins 112 (e.g., external to the trenches T1 and T2). After the planarization process, a remaining portion of first isolation dielectric layer 140 (referring to FIG. 24) may be referred to as a shallow trench isolation (STI) structure 140', and a remaining portion of the second isolation dielectric layer 150 (referring to FIG. 24) may be referred to as isolation dielectric plug 150'.

In some embodiments, because of the asymmetric profile of the trench 140T, the formed isolation dielectric plug 150' may have a corresponding asymmetric profile. For example, a sidewall 150S3 of the isolation dielectric plug 150' facing the fins 112a is asymmetric with a sidewall 150S4 of the isolation dielectric plug 150' facing the fins 112b about a central axis of the isolation dielectric plug 150' normal to the substrate 110. In some embodiments, as aforementioned, the isolation dielectric plug 150' has the trench 150T therein. For example, the sidewall 150S3 is asymmetric with the sidewall 150S4 about a central axis of the trench 150T normal to the substrate 110 (indicated as dashed line L2). In some embodiments, the isolation dielectric plug 150' may have a portion 152 between the trench 150T and the fin 112a and a portion 154 between the trench 150T and the fin 112b, and at the same height level, a thickness 152W of the portion 152 may be different from a thickness 154W of the portion 154. For example, as illustrated in the figure, at the same height level as indicated by the dotted line L1, the thickness 154W is greater than thickness 152W. At other height levels, the thickness 154W may be the same or less than the thickness 154W.

In the present embodiments, since the trench 140T has a largest width at its bottom, the isolation dielectric plug 150' has a shape having a wide bottom and a narrow top. In the present embodiments, a width of the isolation dielectric plug 150' get increased as approaching the bottom of the isolation dielectric plug 150'.

Figure 31:
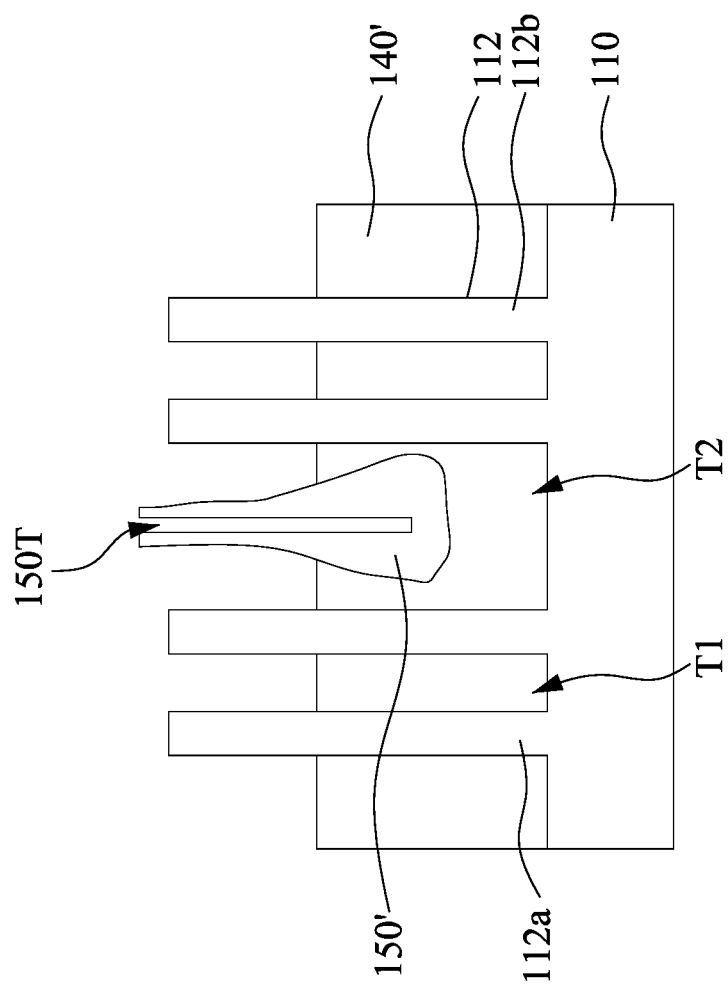

Referring to FIG. 31, the STI structure 140' is recessed through an etching back process, such that the semiconductor fins 112 and the isolation dielectric plug 150' protrude from the top surface of the STI structure 140'.

Figure 32:
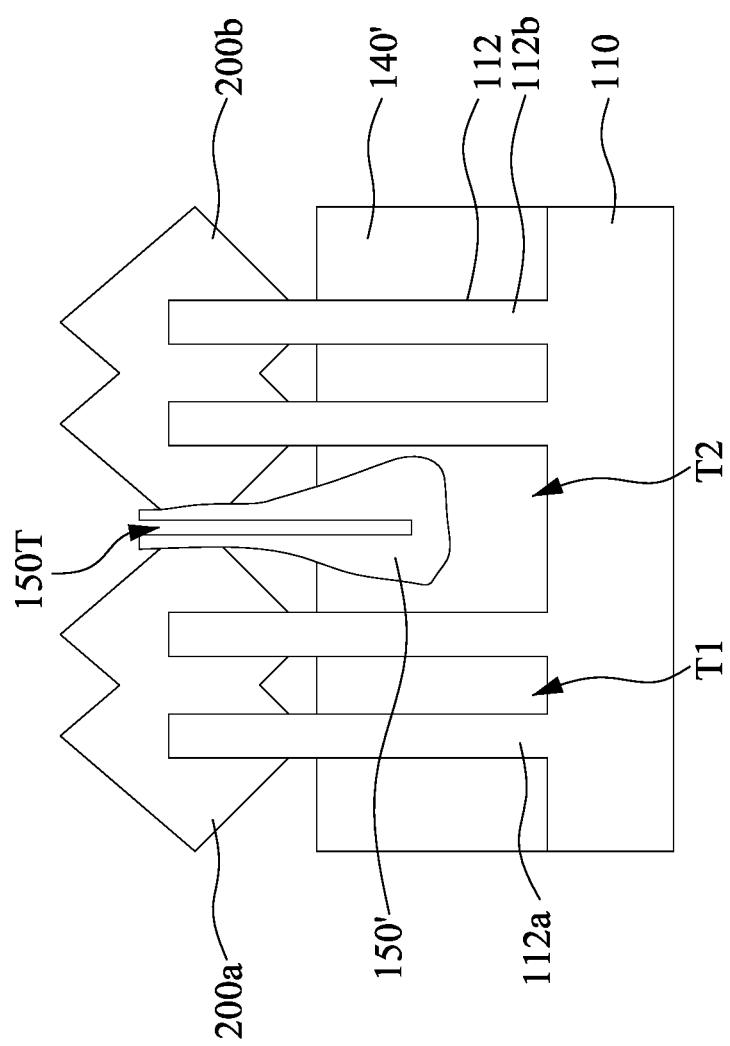

Referring to FIG. 32, epitaxial source/drain structures 200a and 200b are respectively formed over the semiconductor fins 112a and 112b and separated by the isolation dielectric plug 150'. In some embodiments, the epitaxial growth of the source/drain structures 200 may exert force on the top portions of the isolation dielectric plug 150', such that the top portions of the isolation dielectric plug 150' are pushed toward each other, which may also result in the shape of the isolation dielectric plug 150'. For example, a width of a top portion of the isolation dielectric plug 150' between the epitaxial source/drain structures 200 is less than a width of a middle portion of the isolation dielectric plug 150' below the top portion of the isolation dielectric plug 150'. Other details of the present embodiments are similar to those illustrated in FIGS. 2-16B, and will not be repeated herein.

Figure 33:
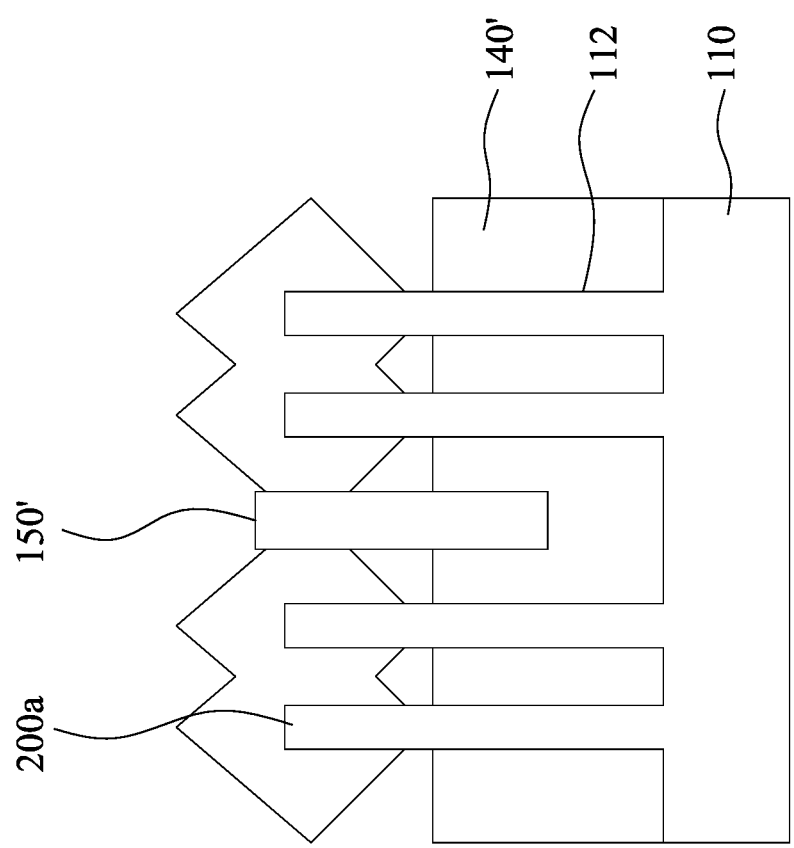
FIG. 33 is a schematic cross-sectional view of a semiconductor device in accordance with some embodiments of the present disclosure.

FIG. 33 is a schematic cross-sectional view of a semiconductor device in accordance with some embodiments of the present disclosure. The present embodiments are similar to those of the embodiments of FIG. 12, except that the isolation dielectric plug 150' is free of the trench 150T (referring to FIG. 12). In the present embodiments, during the fabrication of the isolation dielectric plug 150' (referring to FIGS. 2-12), the deposition of the second isolation dielectric layer 150 (referring to FIGS. 5A and 5B) may fill up the trench T2, which in turn will cause the isolation dielectric plug 150' fill up the trench T2. The second isolation dielectric layer 150 (referring to FIGS. 5A and 5B) may be deposited by ALD, CVD, the like, or the combination thereof. Other details of the present embodiments are similar to those illustrated in FIGS. 2-12, and will not be repeated herein.

Figure 34:
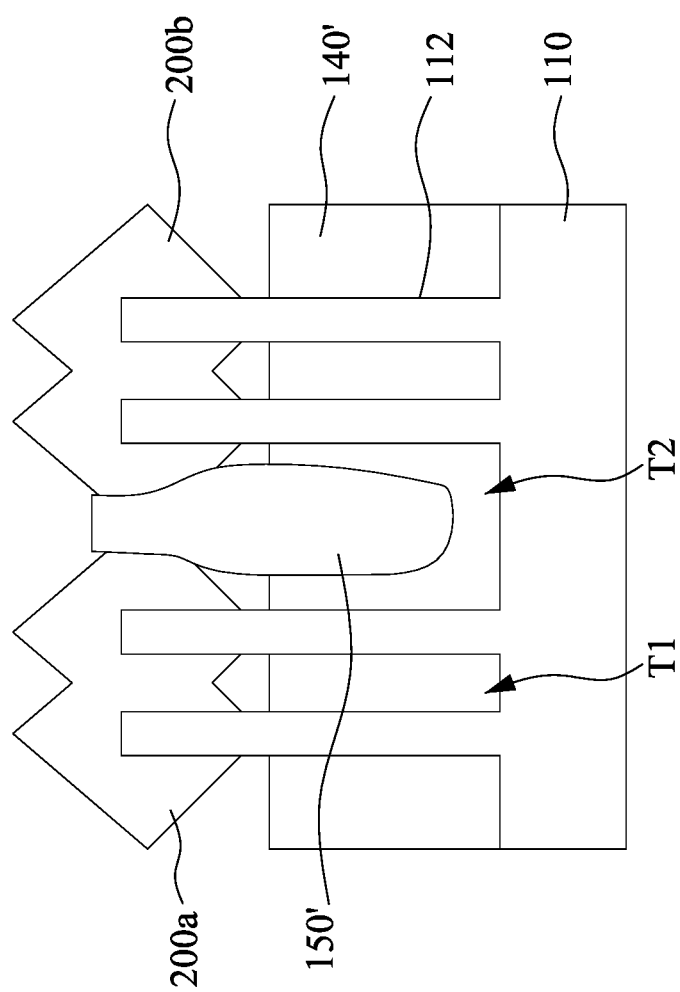
FIG. 34 is a schematic cross-sectional view of a semiconductor device in accordance with some embodiments of the present disclosure.

FIG. 34 is a schematic cross-sectional view of a semiconductor device in accordance with some embodiments of the present disclosure. The present embodiments are similar to those of the embodiments of FIG. 27, except that the isolation dielectric plug 150' is free of the trench 150T (referring to FIG. 27). In the present embodiments, during the fabrication of the isolation dielectric plug 150' (referring to FIGS. 23-27), the deposition of the second isolation dielectric layer 150 (FIG. 24) may fill up the trench T2, such that the resulted isolation dielectric plug 150' may fill up the trench T2. The second isolation dielectric layer 150 (FIG. 24) may be deposited by ALD, CVD, the like, or the combination thereof. Other details of the present embodiments are similar to those illustrated in FIGS. 23-27, and will not be repeated herein.

Figure 35:
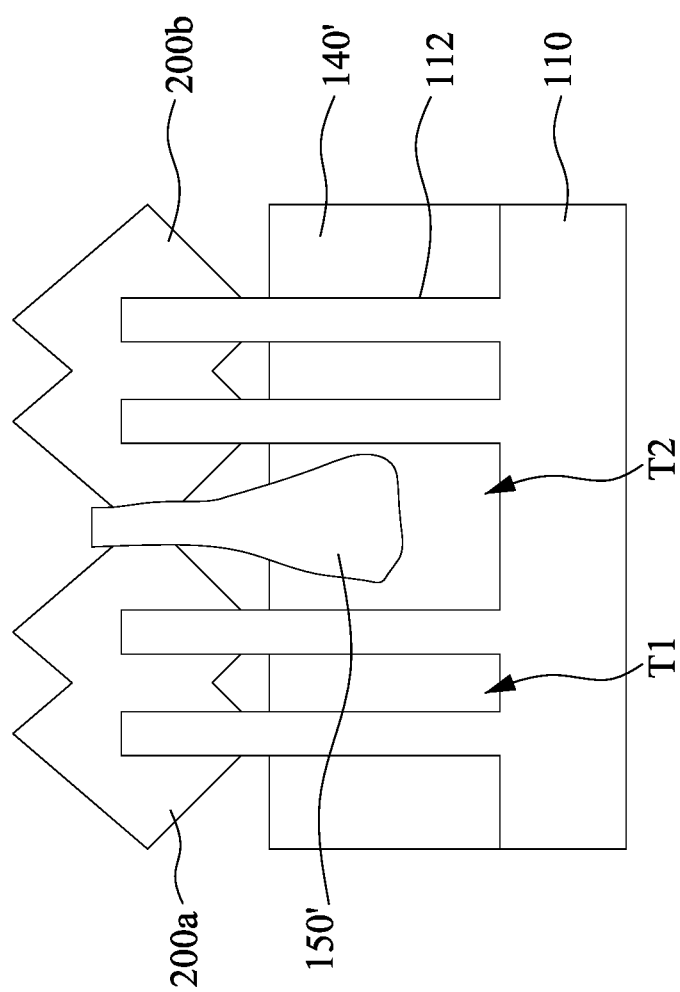
FIG. 35 is a schematic cross-sectional view of a semiconductor device in accordance with some embodiments of the present disclosure.

FIG. 35 is a schematic cross-sectional view of a semiconductor device in accordance with some embodiments of the present disclosure. The present embodiments are similar to those of the embodiments of FIG. 32, except that the isolation dielectric plug 150' is free of the trench 150T (referring to FIG. 32). In the present embodiments, during the fabrication of the isolation dielectric plug 150' (referring to FIGS. 28-32), the deposition of the second isolation dielectric layer 150 (FIG. 29) may fill up the trench T2, which in turn will cause the isolation dielectric plug 150' fill up the trench T2. The second isolation dielectric layer 150 (FIG. 29) may be deposited by an ALD, CVD, the like, or the combination thereof. Other details of the present embodiments are similar to those illustrated in FIGS. 28-32, and will not be repeated herein.

Based on the above discussions, it can be seen that the present disclosure offers advantages. It is understood that other embodiments may offer additional advantages, and not all advantages are necessarily disclosed herein, and that no particular advantage is required for all embodiments. One advantage is that by forming an isolation dielectric plug between two semiconductor fins, sizes of the source/drain structures epitaxially grown on the semiconductor fins can be enlarged without touching each other, thereby lowering electrical resistance. Another advantage is that an air gap may be sealed in the isolation dielectric plug, thereby achieving low capacitance. Through the configuration, an integrated circuit structure with low resistance capacitance (RC) can be fabricated.

According to some embodiments of the present disclosure, a method for forming a semiconductor device is provided. The method includes forming a first semiconductor fin and a second semiconductor fin over a semiconductor substrate; depositing a first isolation dielectric layer over the first and second semiconductor fins, the first isolation dielectric layer having a trench between the first and second semiconductor fins; depositing a second isolation dielectric layer having a first portion over a top surface of the first isolation dielectric layer and a second portion lining the trench of the first isolation dielectric layer; performing a chemical mechanical polish (CMP) process to remove the first portion of the second isolation dielectric layer, while leaving the second portion of the second isolation dielectric layer to form an isolation dielectric plug between the first and second semiconductor fins; and after forming the isolation dielectric plug, forming a first epitaxial structure over the first semiconductor fin and a second epitaxial structure over the second semiconductor fin.

According to some embodiments of the present disclosure, a method for forming a semiconductor device is provided. The method includes forming at least one first semiconductor fin and at least one second semiconductor fin over a semiconductor substrate; depositing an isolation dielectric layer over the semiconductor substrate; forming an isolation dielectric plug over the isolation dielectric layer, wherein the isolation dielectric plug is embedded in the isolation dielectric layer; etching back the isolation dielectric layer to a position below a top surface of the isolation dielectric plug; and forming a first epitaxial structure over the first semiconductor fin and a second epitaxial structure over the second semiconductor fin, wherein the first epitaxial structure is spaced apart from the second epitaxial structure by the isolation dielectric plug.

According to some embodiments of the present disclosure, a semiconductor device is provided. The semiconductor device includes a semiconductor substrate, a first semiconductor fin, a second semiconductor fin, a gate structure, first source/drain epitaxial structures, second source/drain epitaxial structures, and an isolation dielectric plug. The first semiconductor fin and the second semiconductor fin extends from the semiconductor substrate. The gate structure extends cross the first and second semiconductor fins. The first source/drain epitaxial structures are over the first semiconductor fin. The second source/drain epitaxial structures are over the second semiconductor fin. The isolation dielectric plug extends between a first one of the first source/drain epitaxial structures and a first one of the second source/drain epitaxial structures along a first direction parallel to longitudinal axes of the first and second semiconductor fins. The isolation dielectric plug has a U-shape profile when viewed in a cross section taken along a second direction parallel to a longitudinal axis of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
   forming a first semiconductor fin and a second semiconductor fin over a semiconductor substrate;
   depositing a first isolation dielectric layer over the first and second semiconductor fins, the first isolation dielectric layer having a trench between the first and second semiconductor fins;
   depositing a second isolation dielectric layer having a first portion over a top surface of the first isolation dielectric layer and a second portion lining the trench of the first isolation dielectric layer;
   performing a chemical mechanical polish (CMP) process to remove the first portion of the second isolation dielectric layer, while leaving the second portion of the second isolation dielectric layer to form an isolation dielectric plug between the first and second semiconductor fins;
   after forming the isolation dielectric plug, forming a first epitaxial structure over the first semiconductor fin and a second epitaxial structure over the second semiconductor fin; and
   depositing an interlayer dielectric layer over the first and second epitaxial structures and the isolation dielectric plug, wherein the interlayer dielectric layer seals an air gap in the isolation dielectric plug, and a top end of the air gap is higher than a bottom surface of the first epitaxial structure.

2. The method of claim 1, wherein depositing the second isolation dielectric layer is performed such that the second isolation dielectric layer has a trench between the first and second semiconductor fins.

3. The method of claim 1, wherein the CMP process is performed until the first and second semiconductor fins are exposed.

4. The method of claim 1, wherein the CMP process further removes a portion of the first isolation dielectric layer over the first and second semiconductor fins.

5. The method of claim 1, further comprising:
   after performing the CMP process, etching back the first isolation dielectric layer to fall below top ends of the first and second semiconductor fins and a top end of the isolation dielectric plug.

6. The method of claim 5, wherein etching back the first isolation dielectric layer is performed using an etching back process etches the first isolation dielectric layer at a faster etch rate than etching the isolation dielectric plug.

7. The method of claim 1, wherein forming the first and second epitaxial structures is performed such that the first and second epitaxial structures are in contact with opposite sides of the isolation dielectric plug.

8. The method of claim 1, further comprising:
   forming a first contact and a second contact respectively over the first and second epitaxial structures.

9. A method for forming a semiconductor device, comprising:
   forming at least one first semiconductor fin and at least one second semiconductor fin over a semiconductor substrate;
   depositing an isolation dielectric layer over the semiconductor substrate;
   forming an isolation dielectric plug over the isolation dielectric layer, wherein the isolation dielectric plug is embedded in the isolation dielectric layer;
   etching back the isolation dielectric layer to a position below a top surface of the isolation dielectric plug;
   forming a first epitaxial structure over the first semiconductor fin and a second epitaxial structure over the second semiconductor fin, wherein the first epitaxial structure is spaced apart from the second epitaxial structure by the isolation dielectric plug; and forming a contact on the first and second epitaxial structures, wherein the contact extends across the isolation dielectric plug and forming the contact is performed such that an air gap in the isolation dielectric plug is sealed by the contact.

10. The method of claim 9, further comprising:

after etching back the isolation dielectric layer, forming a gate structure over the first and second semiconductor fins and the isolation dielectric plug.

11. The method of claim 10, wherein forming the gate structure is performed such that an air gap is retained between the isolation dielectric plug and the gate structure.

12. The method of claim 9, wherein the isolation dielectric layer is deposited by an atomic layer deposition process.

13. The method of claim 9, wherein forming the first epitaxial structure and the second epitaxial structure is performed such that the first epitaxial structure is formed over a plurality of the first semiconductor fins.

14. The method of claim 13, wherein forming the first epitaxial structure and the second epitaxial structure is performed such that the second epitaxial structure is formed over a plurality of the second semiconductor fins.

15. The method of claim 9, wherein forming the first and second epitaxial structures is performed such that the first and second epitaxial structures are in contact with opposite sides of the isolation dielectric plug.

16. A method for forming a semiconductor device, comprising:

forming at least one first semiconductor fin and at least one second semiconductor fin over a semiconductor substrate;

depositing an isolation dielectric layer over the first semiconductor fin and the second semiconductor fin, wherein the isolation dielectric layer has a first portion and a second portion laterally formed on a sidewall of the first semiconductor fin, the second portion of the isolation dielectric layer is over the first portion of the isolation dielectric layer, and a width of the second portion of the isolation dielectric layer is greater than a width of the first portion of the isolation dielectric layer;

forming an isolation dielectric plug in the isolation dielectric layer, wherein the isolation dielectric plug has a first portion and a second portion over the first portion, and a width of the first portion of the isolation dielectric plug is greater than a width of the second portion of the isolation dielectric plug; and forming a gate structure over the first and second semiconductor fins and the isolation dielectric plug.

17. The method of claim 16, wherein forming the isolation dielectric plug is performed such that the isolation dielectric plug has a trench between the first semiconductor fin and the second semiconductor fin, and forming the gate structure is performed such that the gate structure extends across the trench of the isolation dielectric plug.

18. The method of claim 17, wherein forming the gate structure is performed such that an air gap is retained between the isolation dielectric plug and the gate structure.

19. The method of claim 16, further comprising:

after forming the isolation dielectric plug, removing the second portion of the isolation dielectric layer to expose the sidewall of the first semiconductor fin.

20. The method of claim 19, wherein removing the second portion of the isolation dielectric layer is performed such that a sidewall of the second portion of the isolation dielectric plug is exposed.

* * * * *